(12) United States Patent
Hama et al.

(10) Patent No.: US 6,219,823 B1
(45) Date of Patent: *Apr. 17, 2001

(54) METHOD AND APPARATUS FOR DECIDING A WIRING ROUTE AND FOR DETECTING A CRITICAL CUT

(75) Inventors: Toshiyuki Hama, Tokyo; Hiroaki Etoh, Kawasaki, both of (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,735

(22) Filed: Nov. 12, 1998

Related U.S. Application Data

(63) Continuation of application No. 08/757,718, filed on Nov. 26, 1996, now Pat. No. 5,880,969.

(51) Int. Cl.[7] ................................................. G06F 15/60
(52) U.S. Cl. ................................................. 716/12
(58) Field of Search ..................... 395/500.11, 500.13; 716/12

(56) References Cited

U.S. PATENT DOCUMENTS

| | | | |
|---|---|---|---|
| 5,272,645 | 12/1993 | Kawakami et al. | 395/500.15 |
| 5,361,214 | 11/1994 | Aoki | 395/500.14 |
| 5,583,788 | 12/1996 | Kuribayashi | 395/500.15 |
| 5,627,999 | 5/1997 | Cheng et al. | 395/500.09 |

*Primary Examiner*—Matthew Smith
*Assistant Examiner*—Thuan Do
(74) *Attorney, Agent, or Firm*—Schmeiser, Olsen & Watts; Lawrence R. Fraley

(57) ABSTRACT

A plane is segmented into a plurality of regions whose vertexes are points which include the terminals, and a route search graph is generated. The route search graph expresses a connection relationship between the plurality of regions. A line connecting two objects in a shortest distance is recorded as a critical cut together with a width of wires that can go through the critical cut, the two objects including the terminals. A corresponding relationship relative to the critical cut and, when necessary, position information relative to the critical cut are recorded in edges of one of the plurality of regions related to the critical cut and in a necessary terminal. In deciding the wiring route in the route search graph and when it is detected, by using the position information recorded in a terminal or an edge on the wiring route being decided, that the wiring route has come into a certain region of the plurality of regions, the incoming direction in the critical cut related to the certain region is recorded by referring to the position information used in the detection. Also, when it is detected, from the position information recorded in a terminal or an edge which will be on the wiring route being decided, that the wiring route goes out of the region, it is judged whether the wiring route crosses the related critical cut, from the position information used when detecting the outgoing wiring route by referring to the incoming direction recorded in the related critical cut. Furthermore, when it is judged that the wiring route crosses the critical cut, it is judged whether the wiring route can be wired by referring to the width of wires that can go through the critical cut.

3 Claims, 17 Drawing Sheets

TERMINAL A

| CRITICAL CUT | POSITION RELATIONSHIP | ENTERED REGION |
|---|---|---|
| 2100 | RIGHT | 0° ~ 180° REGION 3000 |
| 2200 | RIGHT | 0° ~ 270° REGION 3000 3100 |
| 2300 | RIGHT | 0° ~ 270° REGION 3000 3100 |
| 2500 | RIGHT | 0° ~ 270° REGION 3000 3100 3300 3400 |
| ⋮ | ⋮ | ⋮ |

FIG. 7

EDGE 1100

| CRITICAL CUT | POSITION RELATIONSHIP | INCOMING DIRECTION |
|---|---|---|
| 2400 | X | X |
| 2100 | LEFT | FROM LEFT TO RIGHT |
| 2200 | RIGHT | FROM LEFT TO RIGHT |
| 2300 | RIGHT | FROM LEFT TO RIGHT |
| ⋮ | ⋮ | ⋮ |

FIG. 8

TERMINAL C

| CRITICAL CUT | POSITION RELATIONSHIP /350 | ENTERED REGION /360 |
|---|---|---|
| 2500 | LEFT | 0° ~90°  REGION 3000<br>180° ~360°  3100<br>3300<br>3400 |
| ⋮ | ⋮ | ⋮ |

(A)   (B)

METHOD AND APPARATUS FOR DECIDING A WIRING ROUTE AND FOR DETECTING A CRITICAL CUT

This application is a continuation of patent application Ser. No. 08/757,718 filed Nov. 26, 1996, issued on Mar. 9, 1999 as U.S. Pat. No. 5,880,969.

BACKGROUND OF THE INVENTION

The present invention relates to a method of automatically deciding wiring routes between terminals on a printed-circuit board or the like. The present invention ensures the requisite thicknesses of the wires and the minimum spacing between wires and confirms that a limitation on the capacity of a wiring route is not exceeded.

The capacity of a wiring route between terminals on a printed-circuit board is based on the required width of the wires, the minimum separation distance between wires, the number of wires required and the space available. Some of the wiring routes are predetermined and viewed as "obstacles" during the subsequent process of laying out the remaining wires. Previously known automatic wiring systems can re-position, by a "push-away" operation, a predetermined wiring route to make room for another wire. When the predetermined wire route is 90° or 45° relative to the new wire, it is possible with conventional routing systems to dynamically re-position the predetermined wire route in a reasonable amount of time. However, it-is not practical using conventional routing systems to re-position a predetermined wire route which lies at other, "free" angles relative to the new wire due to complexity of the calculations required.

A "rubber band" model has also been used to determine wire routing where there are previously wired lines. The rubber band model is representative of routes topologically equivalent and is expressed by a series of "critical cuts". Each critical cut connects two objects in the shortest distance and is considered a line tightly extended between two terminals. If each critical cut does not exceed the wiring capacity, physical positioning of all the wires can be accomplished while meeting the wiring capacity as a whole. See E. Leiserson and F. M. Maley, "Algorithms for Routing and Testing Routability of Planar VLSI layouts," Proc. STOC, pp. 69–78 (1985). Consequently, in the rubber band model the physical position of a previously wired line is not determined during route search for wiring, but it is determined by checking the physical wiring possibility with detailed wiring process after the position of all other wiring routes has been determined.

It is possible and common to convert another type of route expression to a rubber band model in real time. Then an accurate route capacity can be verified by a visibility graph or mesh structure obtained by region segmentation. However, only an approximate route capacity can be estimated automatically with conventional computer systems in a reasonable amount of time because of the complexity of calculating the capacities of all critical cuts. When there is excess room in a wiring region, the approximate determinations of capacity can obtain viable wiring routes. However, many printed circuit boards today have high density, and wiring is required to the very limit of the capacity. Therefore, for typical high-density wiring requirements, conventional routing systems require too much time to make free-angle adjustments between new wires and previously determined wire routes.

DISCLOSURE OF THE INVENTION

Accordingly, an object of the present invention is to make it possible to execute a wiring route search, meeting an accurate route capacity, in a wiring route whose wiring capacity is limited, by checking the capacity of a critical cut during route search for wiring.

Another object is to remove a wasteful recalculation of routes so that an automatic wiring process can be performed at a high speed.

Still another object is to provide a system which is capable of automatic wiring at a free angle.

A further object is to reduce the number of critical cuts whose wiring capacity is checked.

With the reduction in the number of critical cuts, the object of the present invention is also to improve the high-speed operation of the entire process of the route searching for wiring.

To achieve objects such as described above, the present invention is roughly divided into two parts. That is, the present invention includes a part for deciding a wiring route by accurately checking the capacity of a critical cut during route search for wiring and a process of reducing the number of critical cuts to be checked.

First, the former part is achieved by the following steps of:

(a) segmenting a plane into a plurality of regions whose vertexes are points which include the terminals and generating a route search graph which expresses a connection relationship between the plurality of regions;

(b) recording a line connecting two objects in a shortest distance as a critical cut together with a width of wires that can go through the critical cut, wherein the two objects include the terminals;

(c) recording a corresponding relationship relative to the critical cut and, when necessary, position information relative to the critical cut in edges of regions related to the critical cut and in a necessary terminal;

(d) in deciding the wiring route in the route search graph,
(d1) when it is detected, by using the position information recorded in a terminal or an edge on the wiring route being decided, that-the wiring route has come into one region of the plurality of regions, recording an incoming direction in the critical cut related to the one region by referring to the position information used in the detection;
(d2) when it is detected, from the position information recorded in a terminal or an edge which will be on the wiring route being decided, that the wiring route goes out of a region, judging whether the wiring route crosses the related critical cut, from the position information used where detecting the outgoing wiring route by referring to the incoming direction recorded in the related critical cut; and
(d3) when it is judged that the wring route crosses the critical cut, judging whether the wiring route can be wired by referring to the width of wires that can go through the critical cut.

By including these steps, the crossing of each critical cut can be detected with reliability and accurate capacity checking can be performed, so it is unnecessary to perform processing such as subsequently changing a wiring route later.

Also, the aforementioned step (c) may include the steps of.

(c1) when the critical cut is topologically equivalent to an edge of the plurality of regions, recording a corresponding relationship relative to the critical cut in the edge; and (c2) when the critical cut crosses the regions, making a union region consisting of the regions that the critical cut crosses and recording a corresponding relationship and position information relative to the critical cut in edges which are a boundary of the union region, and when a terminal is included in the union region, recording a corresponding relationship and position information relative to the critical cut in the terminal.

If done in this way, processing can be performed with less data.

In addition, the aforementioned step (d1) may include the steps of:

(d11) detecting, by using the position information recorded in a terminal or an edge on the wiring route being decided, whether the wiring route has come into one region of the plurality of regions; and (d12) based on the position information used when detecting that the wiring route has come into one region, recording the incoming direction relative to said critical cut in the critical cut crossing the one region into which the wiring route has come.

Similarly, the aforementioned step (d2) may include the steps of:

(d21) detecting, by using the position information recorded in a terminal or an edge which becomes the wiring route, whether the wiring route goes out of the region into which the wiring route came; and (d22) by referring to the incoming direction recorded in the critical cut, judging whether the wiring route crosses the critical cut, from the outgoing direction based on the position information used when detecting the outgoing wiring route.

In addition to the aforementioned steps, the method of the present invention may further include a step (d4) of:

when it is detected, at the time the wiring route comes into and goes out of the region, that a critical cut, related to an edge which is the boundary of the region, exists, judging whether the wiring route can cross the critical cut by referring to the width of wires that can go through the critical cut.

The aforementioned position information may be a position relationship relative to the critical cut and information for detecting whether the wiring route comes into a region to which a terminal or an edge having the position information belongs. If done in this way, the recording of the incoming direction of the wiring route into a critical cut, whether the wiring route has crossed at the time of leaving, or whether the wiring route comes into a certain region can be simply grasped.

Also, the method of the present invention flier includes a step (d5) of:

when it is judged that the wiring route being decided does not cross the critical cut, clearing the incoming direction recorded in the critical cut. This is because, if the incoming direction remains recorded, sometimes processing makes an error.

In addition, the method of the present invention flier includes a step (d6) of:

when it is judged that the wiring route being decided can cross the critical cut, clearing the incoming direction recorded in the critical cut and recording passage of the wiring route. This is for recording passage and using when another route is searched.

Furthermore, the method of the present invention further includes a step (d7) of:

when it is judged, by referring to the width of wires that can go through the critical cut, that the wiring route cannot cross the critical cut, cutting current branch of the wiring route being decided and clearing the incoming direction in the critical cut. Because the wiring route cannot cross, it must return back.

The segmented regions may be, for example, trapezoidal, however, if each segmented region is formed into a triangular shape, the following advantages will occur.

Edges of the region are constituted by two directed edges different in direction, the directed edges surround the region in one direction, and the critical cut has one direction, and the aforementioned step (c) may include a step of with respect to each directed edge, recording a critical cut where the directed edge is a right boundary, a critical cut where the directed edge is a left boundary, a critical cut where the opposite vertex of the directed edge is on a right boundary, a critical cut where the opposite vertex of the directed edge is on a left boundary, and a critical cut which corresponds to the directed edge, if they east. If done in this way, it will be clear whether a certain region (including a union of regions) is indicated or another region is indicated, and an amount of data to be recorded will be reduced.

When triangular regions are used, the step (d1) may include the steps of:

(dd11) when the wiring route starts from the terminal, recording the incoming direction of the wiring route in a critical cut corresponding to an inner directed edge which is the boundary of a region from which the wiring route goes where the opposite vertex is the terminal; and (dd12) recording an incoming direction in the critical cut recorded in an outer directed edge which is an directed edge that is the boundary of a region into which the wiring route comes.

Likewise, the aforementioned step (d2) may include the steps of:

(dd21) referring to the incoming direction of the critical cut recorded in the inner directed edge and judging whether the wiring route being decided has crossed the critical cut, based on the position of the inner directed edge; and (dd22) when the wiring route goes to the terminal referring to the incoming direction of the critical cut corresponding to the outer directed edge, whose opposite vertex is the terminal and through which the wiring route passed immediately before, and judging whether the wiring route has crossed the critical cut, based on the position of the terminal.

The aforementioned method may further include a step (dd4) of judging, when a critical cut identical with an edge of the triangular region exists, whether the wiring route can cross the critical cut by referring to the width of wires that can go through the critical cut.

As described above, a constitution making the capacity check of the critical cut accurate is shown, and when the number of terminals=n, the number of critical cuts is proportional to $n^2$. Therefore, to perform the entire processing at a high speed, it is necessary to reduce the number of critical cuts to be checked. For this reason, the following steps are executed.

That is, the steps include: calculating the wiring capacity for one critical cut; in a union region consisting of regions that said one critical cut crosses, calculating sum of the wiring capacities of edges or sum of maximum flows of edges, wherein the edges are positioned on one side of the critical cut and constitute a boundary of the union region, and the maximum flow is the maximum width of wires which can pass through the edge; comparing the wiring capacity of the one critical cut with the sum of the wiring capacities of edges or the sum of maximum flows of edges; and when the wiring capacity of the one critical cut is the larger one, which is judged from the comparison result, outputting the one critical cut as a critical cut that is not necessary to check.

Also, if the aforementioned region is a triangular region, a method of detecting a critical cut that is not necessary to check, when checking a wiring capacity by using the critical cut, may include the steps of: calculating a maximum flow by referring to a limitation on the size and disposition of the plane and terminal, the maximum flow being the maximum width of wires that can pass through each edge of the plurality of triangular regions; obtaining the wiling capacity for one critical cut; in a union region consisting of regions that the one critical cut crosses, obtaining the sum of maximum flows of edges, the edges being positioned on one side of the critical cut and constituting a boundary of the union region; comparing the wiring capacity of the one critical cut with the sum of maximum flows; and when the wiring capacity of the one critical cut is the larger one from the comparison result, outputting the one critical cut as a critical cut that is not necessary to check. If the maximum flow is used, the number of critical cuts to be processed can be further reduced.

The step of calculating the sum of maximum flows includes a step of setting, when the edge of the triangular region is a boundary of an obstacle which includes the boundary of the plane and the boundary of a region that cannot be wired, the maximum flow of the edge to zero, and/or a step of causing, when a critical cut from the vertex of the triangular region to the boundary of the obstacle is included in the interior of the triangular region, a maximum flow of an edge other than an edge which is the boundary of the obstacle to be the same as the wiring capacity of the critical cut. If done in this way, a reduction in the number of critical cuts will be more effective.

Particularly, in the case of the triangular regions, the step of calculating the sum of maximum flows may include a step of updating, when the maximum flow of the one edge of a certain triangular region is less than the sum of maximum flows of the other two edges, the maximum flow of one edge to the sum of maximum flows of the other two edges. If done in this way, the maximum flow of each edge will become even smaller.

As another embodiment of the method of detecting a critical cut that is not necessary to check, the method comprises a step of calculating a maximum flow by referring to a limitation on the size and disposition of the plane and terminal the maximum flow being the maximum width of wires that can pass through each edge of the plurality of triangular regions; a first judgment step of judging, in a first triangular region which is outside a second triangular region and which shares an edge, whether the shared edge is visible from one terminal of the second triangular region; a second judgment step of judging, when the shared edge is judged to be visible, whether a critical cut between a terminal which is the opposite vertex of the shared edge and the one terminal is visible from the one terminal; a step of calculating, when the critical cut is judged to be visible, the sum of maximum flows of edges of a boundary positioned on one side of the critical cut, in a union region consisting of triangular regions that the critical cut crosses; a step of comparing a wiring capacity of the critical cut with the sum of maximum flows; and a step of outputting the critical cut as a critical cut that is not necessary to check, when the wing capacity of the critical cut is the larger one from the comparison result.

The above method may further comprise a step of recording the smaller one of the sum of maximum flows or the wring capacity of the critical cut as the maximum flow of the critical cut, and a step of making the shared edge to be an edge which a new triangular region added to the union region and the union region share, and making the edge of the boundary positioned on one side of the critical cut to be either edges of a boundary positioned on one side of a new critical cut or the critical cut and one edge of the new triangular region, and executing the first judgment step and the steps thereafter. With this, it can be sequentially judged whether or not a critical cut needs to be checked.

It is beneficial that the aforementioned method of detecting a critical cut that is not necessary to check is included in the aforementioned step (b). With this, the number of critical cuts which are recorded is reduced and the route search for wiring is performed at a high speed.

Note that making a system for executing the aforementioned steps, preparing a program for executing the aforementioned steps, and storing the program in a well-known memory unit and recording medium are apparent to those having skill in this field and therefore the details will not be given.

BRIEF DESCRIPTION OF THE DRAWINGS

FIG. 7 is a diagram showing data that a terminal (A) includes in the example of FIG. 5;

FIG. 8 is a diagram showing data that an edge 1100 includes in the example of FIG. 5;

Best Mode For Carrying Out The Invention

A. Wiring-Route Decision Process (1) Segmentation of a region to be wired

Figure 1:
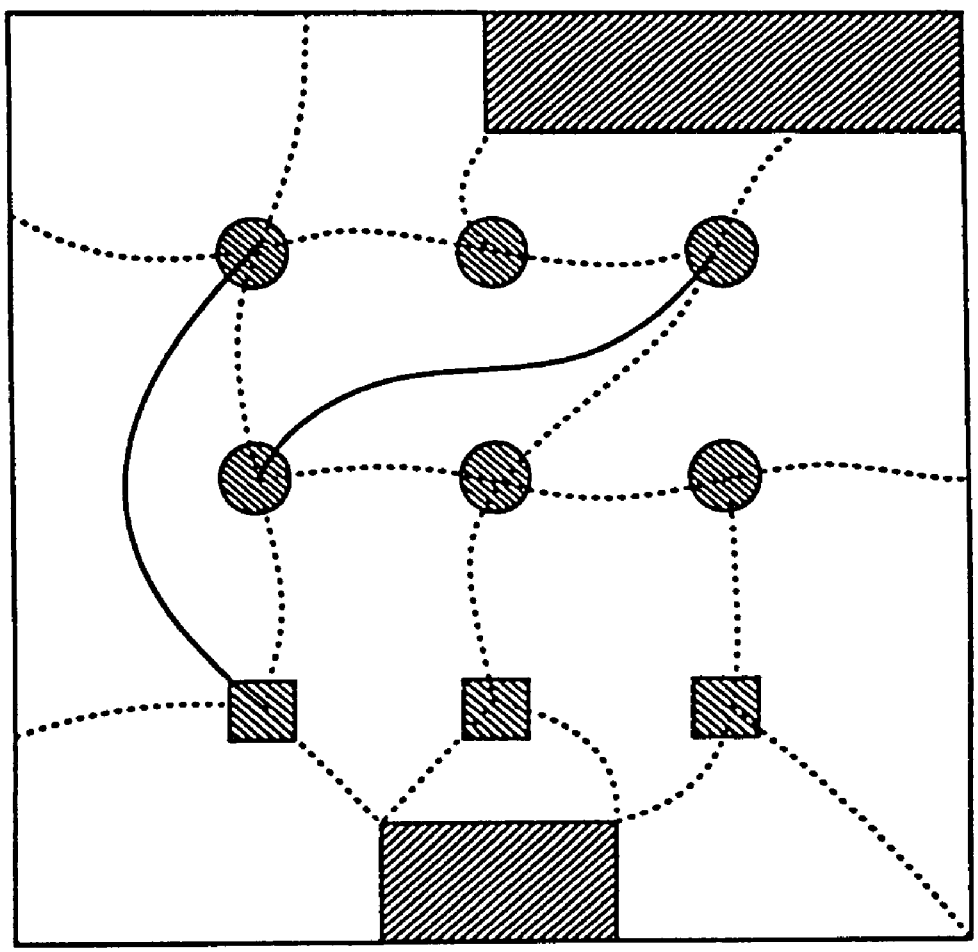
FIG. 1 is a diagram showing an example of the region segmentation of a board.

The wiring-route decision process begins first with segmenting a region into a plurality of regions to be wired. The regions to be wired are a plurality of closed regions exclusive of wiring inhibition regions from the configuration of a printed-circuit board. The closed region can include terminals on the interior or periphery thereof, but the terminal is assumed to be a point (although a real terminal has a size), and a region is segmented so that all terminals are on the boundaries of the segmented regions. If a region is segmented, for example, by a method described in W. L. Shieles et al, "A Gridless Router for Industrial Design Rules," pp. 626–631, 27th ACM/IEEE Design Automation Conference, 1990, the region can be segmented into a plurality of trapezoidal regions. If a method is used which is described in Y. Lu and W. Dai, "A numerical stable algorithm for constructing constrained delaunay triangulation and application to multichip module layout," Proc. International Conference on Circuits and Systems, 1991, a region can also be segmented into a plurality of triangular regions. However, the present invention is not limited to these methods. The vertexes on the boundaries of segmented regions are defined as follows. (1) All terminals are assumed to be vertexes. (2) At the same time, all points which are the boundaries of three or more regions (including an external portion other than a wired region) are assumed to be vertexes. (3) Arbitrary points on the other boundaries can be vertexes. At the same time, the portion between the vertexes defined in this way on the boundary of the segmented region is referred to as an edge of the segmented region. The state of the region processed up to this point is shown in FIG. 1.

(2) Search Graph Generation

Figure 2:
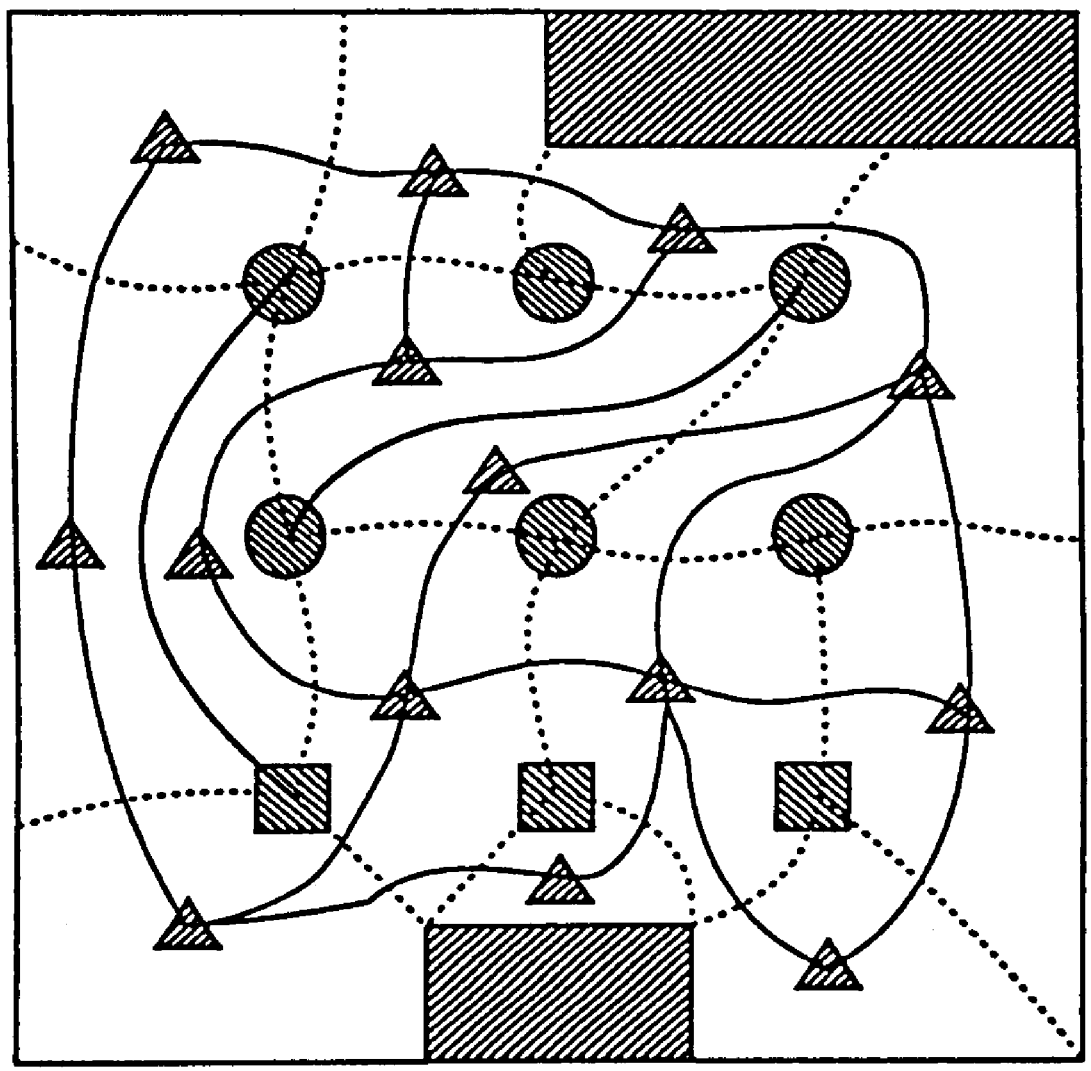
FIG. 2 is a diagram showing an example of a search graph.
Figure 3:
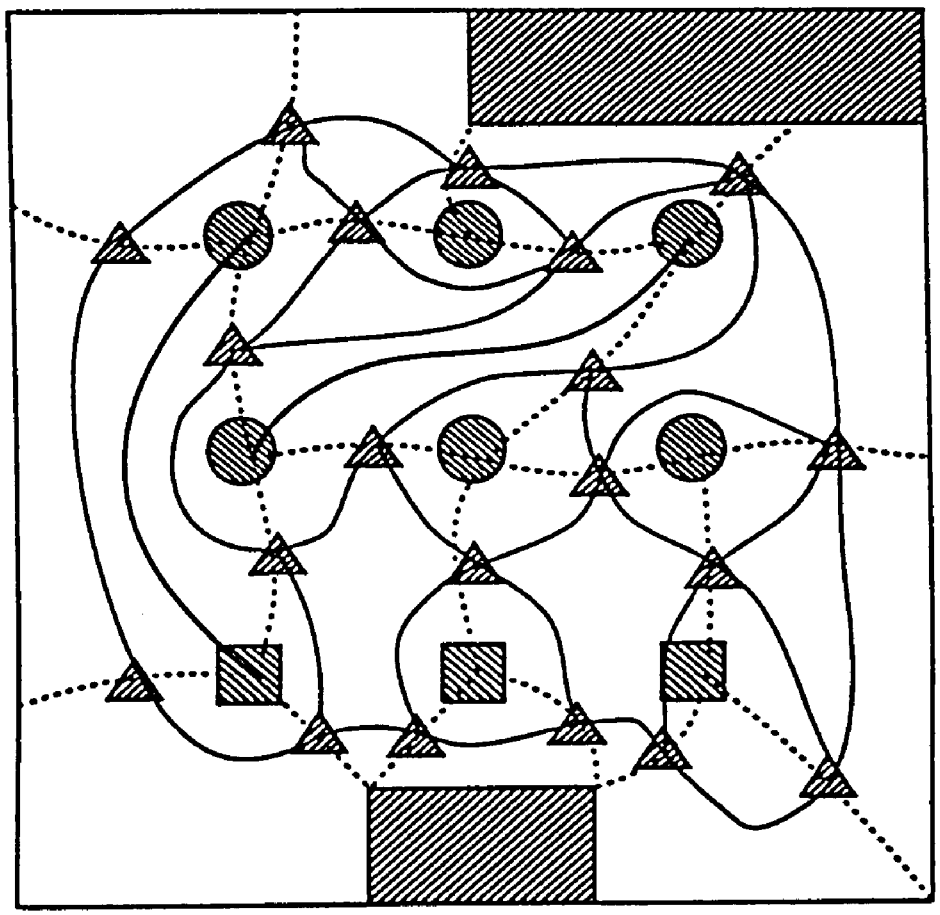
FIG. 3 is a diagram showing the dual graph of the search graph of FIG. 2.

The data structure which expresses the relation of connection between a plurality of regions segmented in the aforementioned way is referred to as a route search graph. The route search graph is, for example, a graph where a segmented region is expressed as a node and an edge is extended between adjacent nodes and crosses the boundary between the adjacent regions (e.g., FIG. 2), or the dual graph (e.g., FIG. 3). The route of a wire is expressed as a route on the search graph.

(3) Process of Registering Critical Cuts

A process for preparation is performed here so that a critical cut which crosses a route being decided can be identified at once during the routing on the search graph. Because the search graph expresses the position relationship between the segmented regions, the edge or vertex of the segmented region can be easily referred to during routing (search for wiring). Then, the following critical cuts and additional information are registered in the edge and the vertex of each region.

The registration process will be described with FIG. 4, centering on critical cuts. In the process started at step 100, one critical cut is first taken out (step 110). Then the critical cut is classified (step 120). More particularly, the case where the critical cut and the continuous edge of a region segmented are on the same topological route (they are topologically equivalent.) is defined as a type 1, and the case where a critical cut crosses segmented regions is defined as a type 2. In an example of FIG. 5 a critical cut 2000 going from a terminal (A) to the boundary of the board is a critical cut of the type 1, and an edge topologically corresponding to the critical cut 2000 is an edge 1000. Also, because a critical cut 2100 going from a terminal (B) to the same boundary of the board crosses a region 3000, the critical cut 2100 is a critical cut of the type 2.

If a critical cut taken out in step 120 is the type 1, corresponding information is recorded in an edge (step 130). The corresponding information is to place a pointer so that the edge and the critical cut are in a corresponding relationship. In the case of the aforementioned critical cut 2000, the corresponding relationship relative to the edge 1000 is recorded. Also, if a critical cut taken out is the type 2, regions that the critical cut crosses will be identified, the following registration will be performed for edges (excluding the periphery of the board and the periphery of an inhibition region) which become the boundaries between the union region (consisting of regions that a critical cut crosses) and other regions (step 140). (1) Corresponding information. This is the same as the aforementioned type 1. (2) Position relationship with a critical cut. An appropriate direction is set to the critical cut and it is recorded whether the edge is positioned on the right side or left side of the critical cut. Because it will become necessary later to know that a critical cut is crossed from which direction to which direction, the position relationship will be used at that time. (3) Incoming direction into a union region. It is recorded which direction of the edge it passes when a route comes into the union region. The incoming direction into a union region also needs to be detected later.

Figure 5:
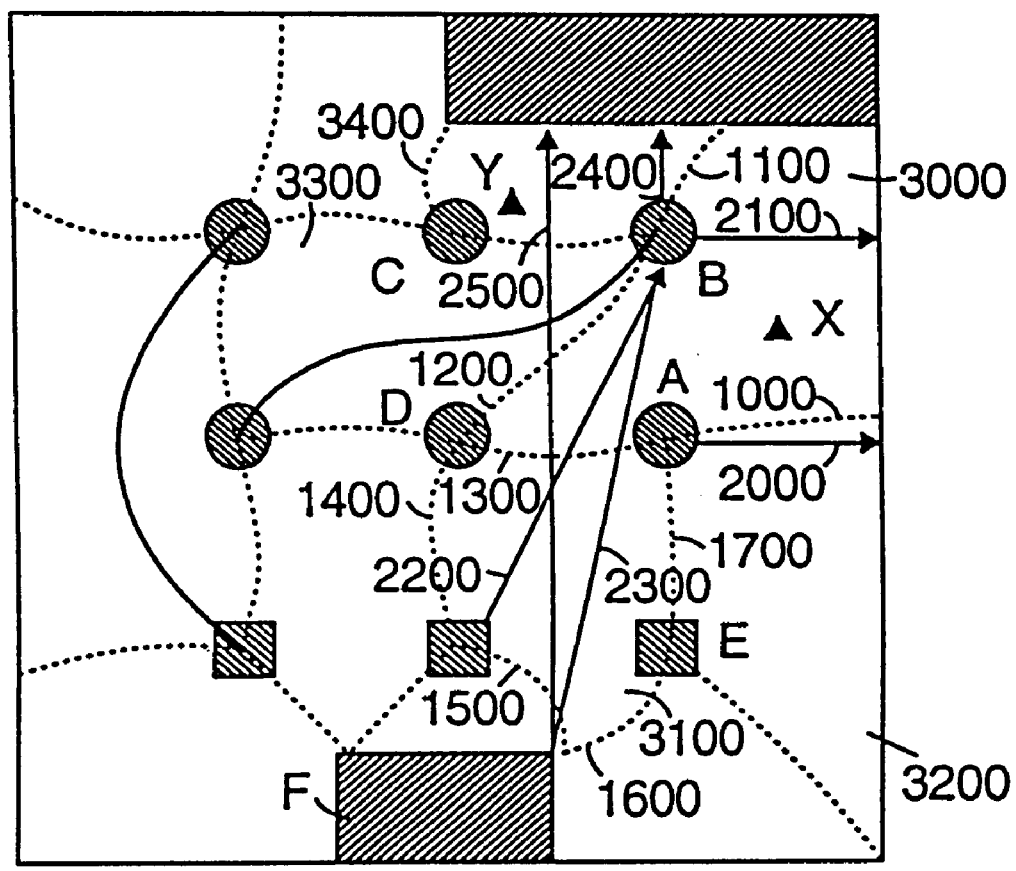
FIG. 5 is a diagram for explaining an example of the route search.

Consider the aforementioned critical cut 2100, for example. The region that the critical cut 2100 crosses is only a region 3000. The region 3000 has four edges 1000, 1100, 1200, and 1300. The remaining edges are the periphery of the board and the periphery of a wiring inhibition region. The critical cut 2100 is assumed to have its direction from right to left, as shown in FIG. 5. Therefore, in the edge 1000, (1) the pointer to (or from) the critical cut 2100 is registered, (2) an index representative of "right", which is the position relationship, is registered, and (3) an index representative of "bottom to top", which is an incoming direction, is registered. In the same way, registration is performed also for the remaining edges 1100, 1200, and 1300.

Consider the case of the critical cut 2200. In this case the regions that the critical cut 2200 crosses are regions 3000 and 3100. Therefore, the edges of the periphery of the union region consisting of the regions 3000 and 3100 are edges 1000, 1100, 1200, 1400, 1500, 1600, and 1700. The direction of the critical cut 2200 is assumed as shown in FIG. 5. Therefore, (1) the pointer to (or from) the critical cut 2200, (2) an index representative of "left", which is the position relationship, and (3) an index representative of "left to right", which is an incoming direction, are registered in the edge 1200.

Also, the terminal previously shown can be the vertex of a union region. Therefore the following items are registered in the terminal. (1) Corresponding information. A pointer to (or from) a critical cut can be registered. (2) Position relationship with respect to a critical cut. Because an direction is given to the critical cut, it is recorded whether a terminal is on the left side or right side of the critical cut. (3) An entered range indicating which region a route comes into among regions sharing a terminal which is a vertex, depending upon the diction in which the route goes. An angle, for example, is recorded for the entered range. This is because it is considered that routing begins with a terminal and because in such a case it is necessary to recognize which region a route first comes into.

In the case of the aforementioned critical cut 2100, the following items are recorded in the terminal (A). (1) Pointer to (or from) the critical cut 2100. (2) Index representative of "right", which is the position relationship between the critical cut 2100 and the terminal (A). (3) In this case, the critical cut 2100 goes into the region 3000 at an angle of 0° to 180° and therefore an index representative of that meaning is registered.

Although a terminal (B) is included in the region 3000 that the critical cut 2100 crosses, it is the start point of the critical cut 2000 and therefore the aforementioned information is not recorded in a point such as this. This is because recording is meaningless for a point in which "right" or "left," which is a position relationship, cannot be recorded. Of course, no information is registered also for a terminal which becomes the end point of a critical cut.

The aforementioned registration process is performed for all critical cuts. Therefore, if there is a unprocessed critical cut, then the process will return to step 110 (step 160), and if there is no unprocessed critical cut, the process will be ended (step 170).

(4) Process of Identifying a Crossing Critical Cut

The route of a wire is found by the route search for wiring on the aforementioned search graph. A routing method where one partial route starts with a terminal and is grown, such as a well-known depth-first or breadth-firs search method, used as a route search algorithm. At the time it has been judged that the partial route which is growing crosses a critical cut, the capacity of the wire route is checked and the growth of an inappropriate partial route is pruned at the early time.

Figure 6:
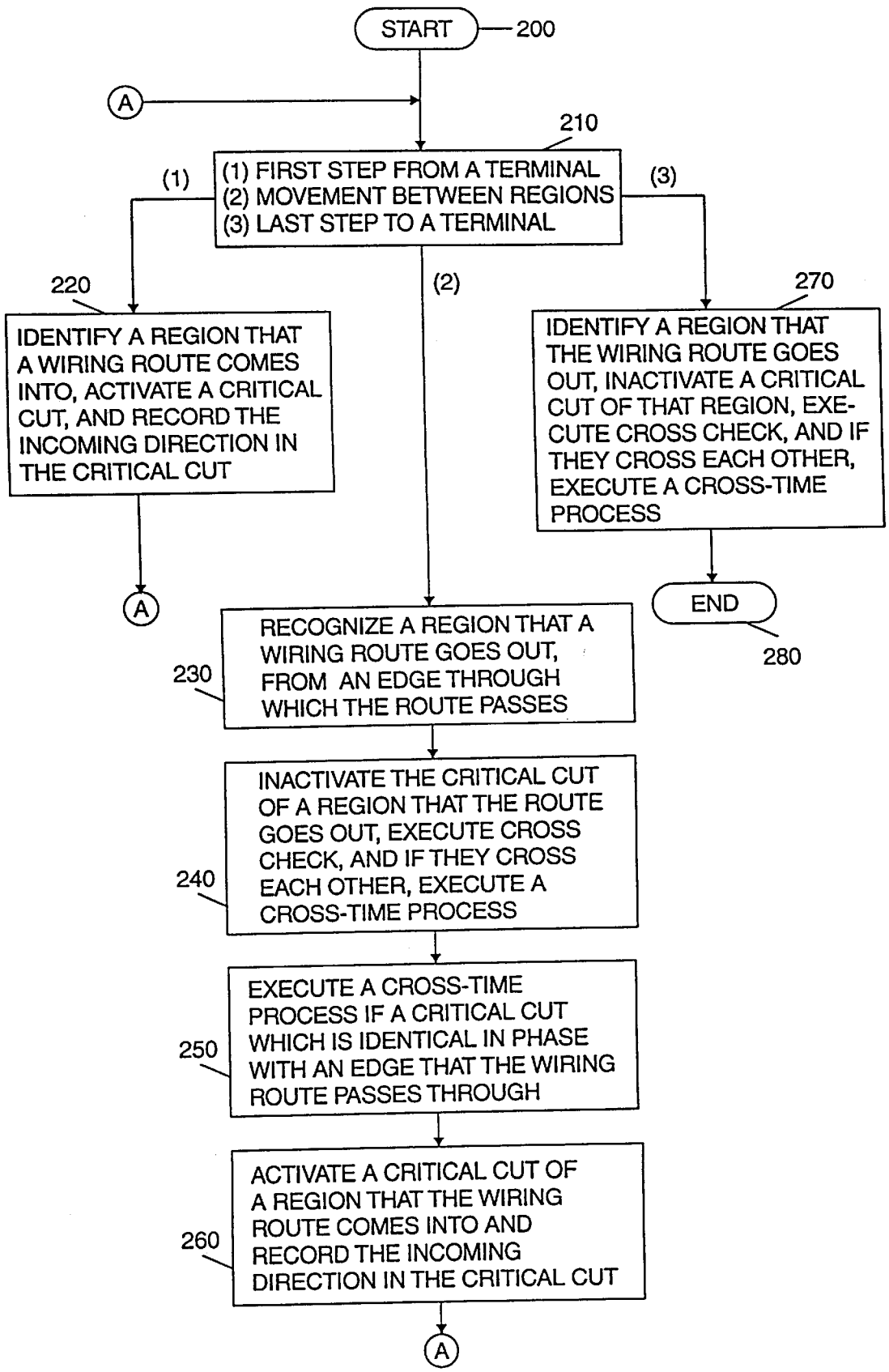
FIG. 6 is a diagram showing a processing flow for explaining the execution of crossing check and cross-time processing.

The following process (FIG. 6) is performed with the aforementioned object. The process started at step 200 is classified into three cases at step 210. That is, the three cases are (1) the case of the first step from a terminal, (2) the case of the movement between regions, and (3) the case of the last step to a terminal. Now, in the case where a process is determined to be the case of (1), a region into which a route goes is known from the direction of the wiring route being decided. As described above, the information on an entered range has been recorded in terminals and therefore this information is used to find a region into which the wing route goes. If the region into which the wiring route goes is recognized, a critical cut related to that region is activated. The related critical cut is a critical cut such as crossing a region that the wiring route goes into, and a critical cut which is homotopic to an edge of the region is excluded. Also, the activation is for specifying an object of judgment to judge later whether the wiring route being decided has crossed a critical cut. The direction in which the wiring route comes into a region is recorded in a critical cut (step 220). As described above, the position relationship with respect to a critical cut has been recorded in terminals. Therefore, if this information is used, the direction in which the wiring route comes into a region will be found. For example, if a terminal is on the right side of a critical cut, an identifier representative of "right" will be recorded in the critical cut. In the case of (1), if this process ends, it returns to step 210.

The case of (2) is simply a case of the movement between regions, so the wiring route always passes through a certain edge. The region and the incoming direction into a union region are recorded in the edge through which the wiring route has passed. Therefore, if the direction is opposite, it can be judged that the wiring route has gone out of a region. Also, the region from which the wiring route has gone can be recognized (step 230). If the region from which the wiring route has gone is found, the activated critical cut of that region will be inactivated. The inactivation of the critical cut includes, after an incoming direction is take out for cross check, the recording of the recorded incoming direction is cleared. At this time, cross check is performed. The purpose of the cross check is to judge whether the wiring route has crossed a critical cut, from the position relation of the edge to a critical cut by referring to the incoming direction of the wiring route recorded in the critical cut. That is, if the recorded incoming direction is "right," it can be judged that there is no passage when the position relation of the edge that the wiring route passes through indicates "right." In the same way, it can be judged that there is passage when the position relation indicates "left." When it is found that the wiring route has crossed a critical cut, it must be judged whether the wiring route can cross a critical cut. This is a process at the time of crossing, and it is checked whether the sum of the width of previously fixed wires (previously wired lines) and the width of the wiring route being decided has exceeded the wiring capacity of the critical cut. Of course, when the sum exceeds the wiring capacity of the critical cut, the routing of this portion is meaningless and so the routing is stopped. When, on the other hand, the sum does not exceed the wiring capacity of the critical cut, the passage of the wiring route is recorded in that critical cut.

When the corresponding information of an edge that the wiring route passes through indicates that a critical cut homotopic to the edge exists, the wiring route always crosses this critical cut and therefore the aforementioned process at the time of crossing is performed (step 250). Passing through an edge means that the wiring route comes into a new region. Therefore, from the incoming direction of the edge a region that the wiring route comes into is recognized, and the critical cut related to the region is activated. At the same time, the incoming direction is also registered in the critical cut. The related critical cut is the same as that previously described. If the process up to this point ends, it returns to step 210 for processing the leaving and entry of the wiring into the next region.

In the case of the last (3), a region that the wiring route goes out can be recognized by using the reverse of the recorded entered range from the direction of the wiring route. At the same time the activated critical cut of the recognized region is inactivated, crossing check is carried out. When it is judged in this cross check that the wiring route has crossed a critical cut, the process at the time of crossing is carried out (step 270). If this process ends, the wiring route from a certain terminal to a certain terminal will be has been decided.

In the case of the aforementioned depth-first search when it is recognized in the capacity check of a critical cut that a process must return the cross information recorded in the critical cut is processed so that it returns to the original state and then another route is searched for wiring.

By repeating the aforementioned process, route search for wiring can be executed while verifying that a wiring capacity is accurately met.

The case where a route going from the terminal (A) of FIG. 5 to the terminal (C) is decided, which is a simple process example, will be shown below. Information such as that shown in FIG. 7 has been recorded in the terminal (A). The information shown in FIG. 7 is the same as that described in the aforementioned process of registering critical cuts, and only the information related to this example is shown. That is, in the case of the terminal (A) it is necessary to hold the information about the critical cut connecting the terminals (D) and E) together, but the information is not shown in this example. When route search for wiring is performed from the terminal (A), the wiring route is first moved from the terminal (A) to the node X of the search graph. In this case if an entered range from the terminal (A) is referred to, the entered region is, of course, a region 3000. Referring to the entered region column (330) of FIG. 7, it is found that critical cuts 2100, 2200, 2300, and 2500 are related to the case where the wiring route goes from the terminal (A) into the region 3000. Therefore, these critical cuts are activated. By referring to the position relationship (300) relative to each critical cut of the terminal (A), it is recorded in the critical cut 2100 that the wiring route entered from right and it is recorded in the critical cut 2200 that the wiring route entered from right. In a similar way, it is recorded in the critical cut 2300 that the wiring route entered from right and it is recorded in the critical cut 2500 that the wiring route entered from right.

The wiring route is now in the node X of the search graph and consider the case where the wiring route moves from X to Y. If so, the wig route passes through the edge 1100. The information of the edge 1100 is shown in FIG. 8. As previously described, only the information related to this example is shown In the critical cuts 2100, 2200, and 2300 among the critical cuts included in this registration information, the incoming direction is "left to right." Therefore, because the movement from X to Y is opposite the incoming direction, it can be recognized for these critical cuts that the wiring route leaves from a region or union region that the edge 1100 belongs to. If the leaving of the wiring route is recognized, the critical cuts which have been activated is inactivated and, at the same time, the crossing check is performed with respect to the critical cuts. Since "right" has been recorded in the critical cut 2100 and the position relationship relative to the critical cut 2100 of the edge 1100 is "left" as shown in the positional relationship column (310) of the edge 1100, it is found that the wiring route has crossed. If the wiring route has crossed, then the process at the time of crossing will be performed. In this example a description of this process will not be given. However, it is assumed that wiring (crossing) is possible. Also, "right" is recorded in the critical cuts 2200 and 2300 and the position relationships relative to the critical cuts 2200 and 2300 are both "right" as shown in the positional relationship column (310) of the edge 1100, so that it is found that the wiring route has not crossed. In addition, the critical cut 2500 is not registered in the edge 1100 shown in FIG. 8. Therefore the critical cut 2500 remains activated.

If a critical cut where only the edge 1100 and corresponding information are recorded is next searched, a critical cut 2400 is found The critical cut 2400 and the wiring route being searched always cross each other, so the process at the time of crossing is performed.

Figures 9, 10:
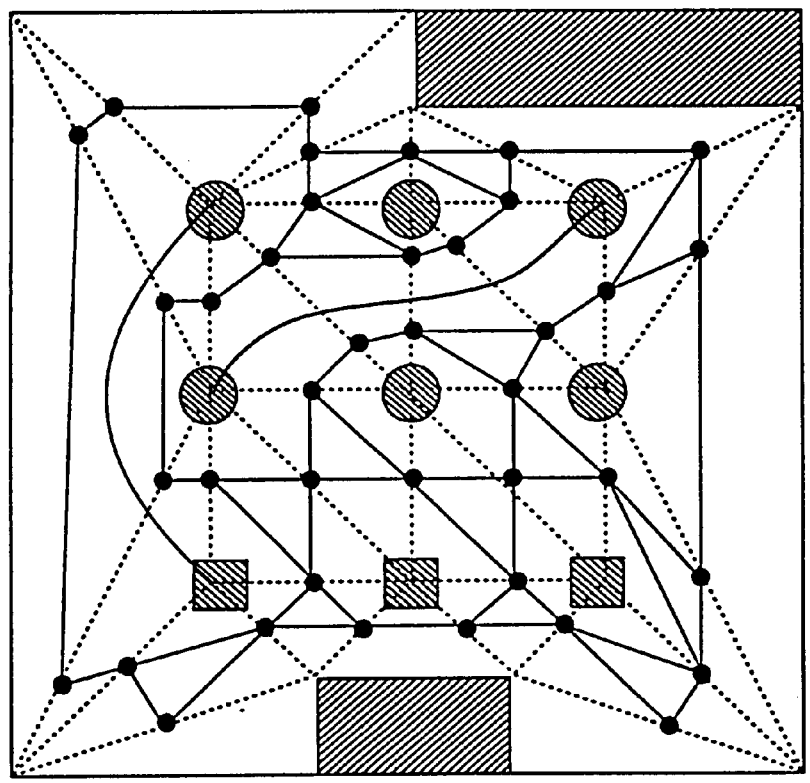
FIG. 9 is a diagram showing data that a terminal (C) includes in the example of FIG. 5.
FIG. 10 is a diagram showing an example of the case where a region is segmented into triangular regions and the node of the search graph is provided on the edge of the triangular region.

If the wiring route is connected from the node (Y) of the search graph to the terminal (C), the data recorded in the terminal (C), shown in FIG. 9, will be referred to. Even in the figure, only the data related to this process is recorded. The critical cut of a region from which the wiling route leaves is found to be only the critical cut 2500, from the entered range column 360 of FIG. 9 and because the wiring route leaves from the region 3400 of the node Y of the search graph. The critical cut 2500 is inactivated and the cross check is performed. In the cross check it can be judged that the wiring route has crossed, because in the process of the terminal (A) the entry from "right" has been recorded in the critical cut and the positional relationship relative to the critical cut 2500 is "left" as shown in the positional relationship column 350 of FIG. 9. Therefore, the process at the time of crossing is carried out, and if crossing is possible, the wiring route can get up to the terminal C.

As described above, by checking a great number of critical cut, route search for wiring can also be executed while accurately checking a wiring capacity.

B. Processing in the Case of Triangular Segmentation

The aforementioned example has been described in a case where a region is generally segmented into regions having arbitrary shapes by some method. However, if a segmented region is limited to a triangular shape, even simpler registration processing and routing process can be performed. A description will hereinafter be made of the case where triangular segmentation is performed.

(1) Triangular Segmentation and Process of Generating a Search Graph

The triangular segmentation and the process of generating a search graph are described in detail in reference 1 mentioned above (Background) and so the details will not be given. The results obtained by carrying out such processing with respect to FIG. 1 are shown in FIG. 10.

(2) Process-of Registering Critical Cuts

Figure 11:
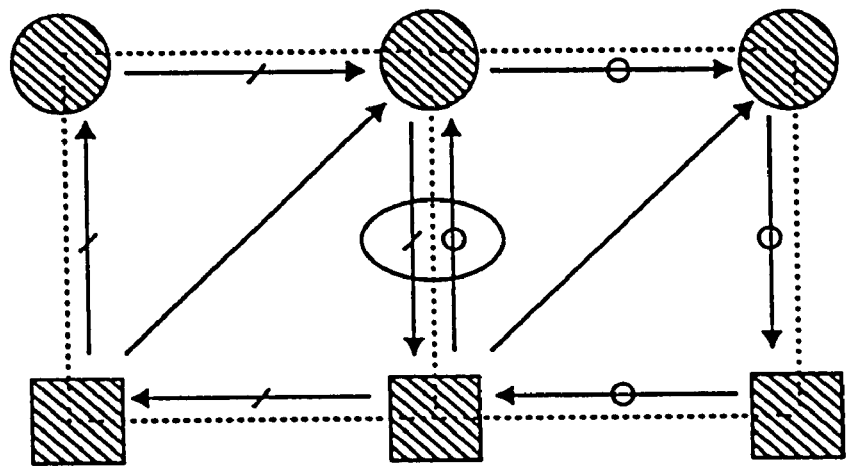
FIG. 11 is a diagram for explaining directed edges.

In performing this process, an appropriate direction is set to each critical cut in the aforementioned same way. Also, because a region is segmented into triangles, the critical cut is either a line connecting the vertexes of a triangle or a perpendicular from the vertex of one triangle to an edge of another triangle. Therefore, consider a union region consisting of triangles through which the critical cut goes. To identify the incoming direction to the union region consisting of triangular regions, it is assumed that the edge of a triangle is expressed with two directed edges of two directions as shown in FIG. 11. In addition, the directed edges surrounding the union region in a counterclockwise or clockwise direction are defined as the boundaries of that union region. With this assumption, in the case where the directed edges surrounding the union region in a counterclockwise direction, the wiring route being decided will come into the union region if it crosses the edge of the union region right to left and will go out of the union region if it crosses the edge of the union region left to right. Therefore, this makes it unnecessary to record the incoming direction which has been explicitly recorded in the aforementioned example. For the directed edges surrounding the union region in a clockwise direction, the foregoing description becomes opposite.

Figure 12:
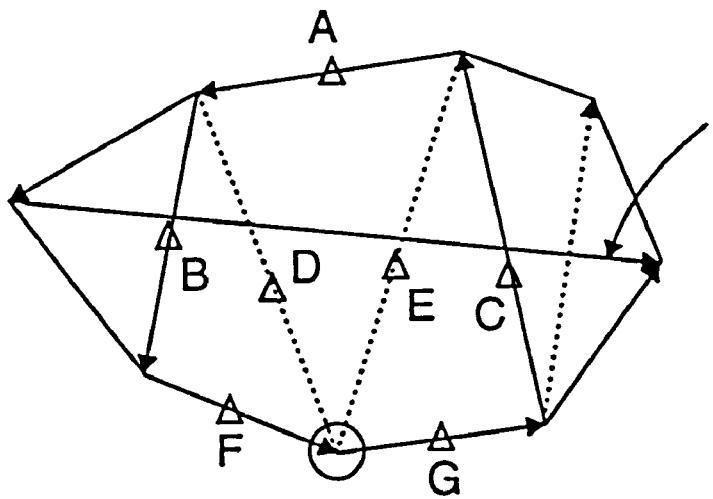
FIG. 12 is a diagram for explaining a recording method in the case where a union region includes a terminal.

Also, even in the case where a terminal is included in a union region, all that needs to be registered are only directed edges. That is, a critical cut and information on "left" or "right" are registered in directed edges (a), (b), and (c) included in a union region which surrounds the critical cut, as shown in FIG. 12. Because the nodes of the search graph are provided on edges, as shown in FIG. 10, if the movement of the wiring route into a union region surrounding a critical cut such as FIG. 12 is assumed, the movement from a certain terminal to a certain node will always reach the node (a, b, and c) provided on the boundaries of a union region which surrounds that vertex (terminal). The movement to other nodes such as nodes (d) and (e) makes no sense, because nodes to which the wiring route moves after the nodes (d) and (e) become nodes (a), (b), (c), (f), and (g). Therefore, in an example such as FIG. 12 the directed edge and the information on "left" or "right" are recorded in the directed edges (a), (b), and (c). With this, it becomes found which triangular region a route goes into, depending upon the direction in which the wiring route grows. The point here is that the direction of vectors going from a terminal to the directed edges (a), (b), and (c) becomes a direction which goes out of the union region when viewed from the directed edges (a), (b), and (c), whether the direction of the directed edges surrounding a critical cut is clockwise or counter-clockwise. Referring to FIG. 12, the direction of the directed edges (a), (b), and (c) is counterclockwise and therefore a direction from right to left becomes an incoming direction, but the direction of a branch (route) going out of a terminal always becomes left to right and corresponds to an outgoing direction.

To make a long story short, in each directed edge, (1) a critical cut where the directed edge is a right boundary, (2) a critical cut where the directed edge is a left boundary, (3) a critical cut where the opposite vertex of the directed edge is on a right boundary, (4) a critical cut where the opposite vertex of the directed edge is on a left boundary, and (5) a critical cut which corresponds to the directed edge, if they exist, are registered.

Figure 4:
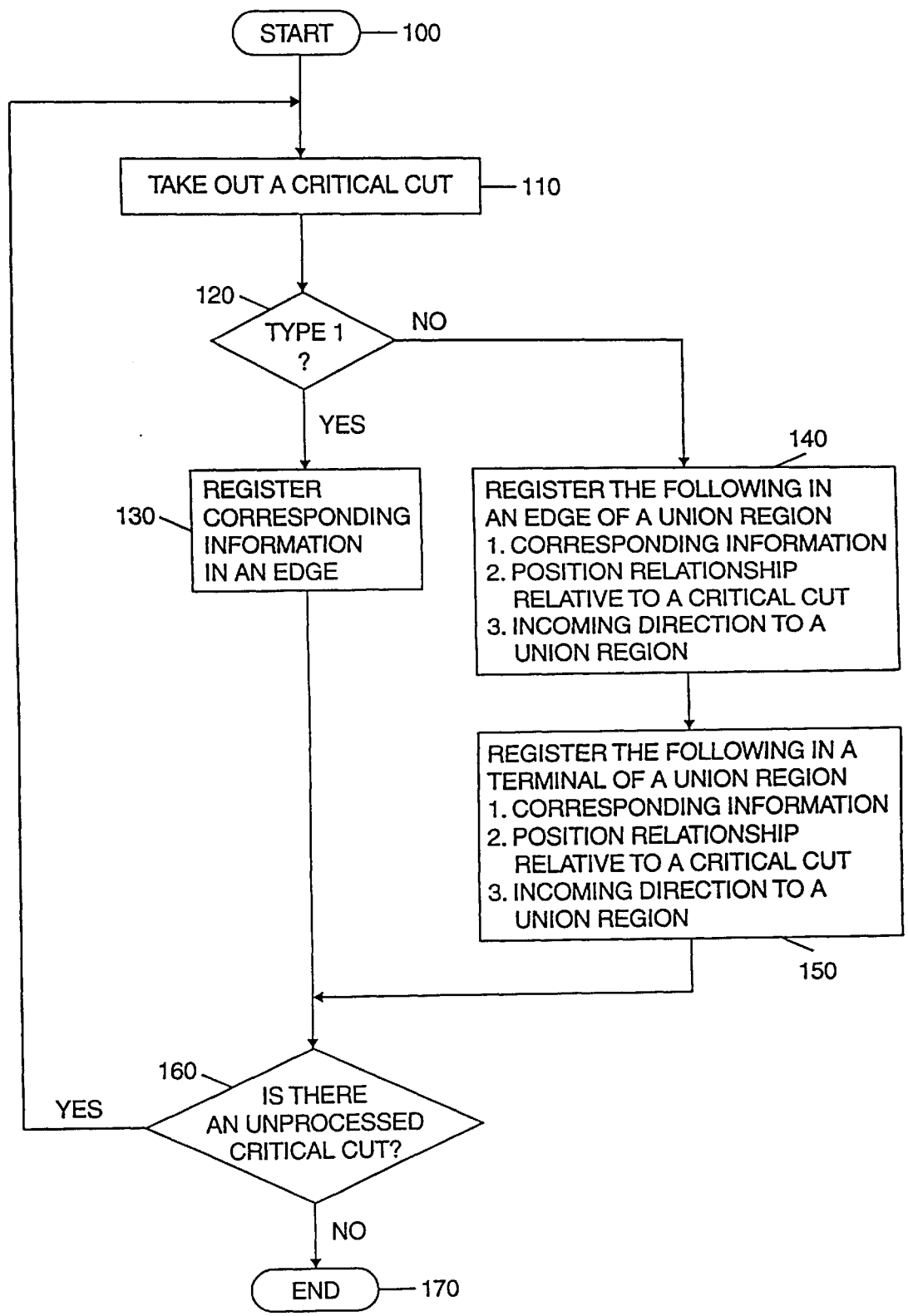
FIG. 4 is a diagram showing a processing flow for explaining a method of registering critical cuts.
Figure 13:
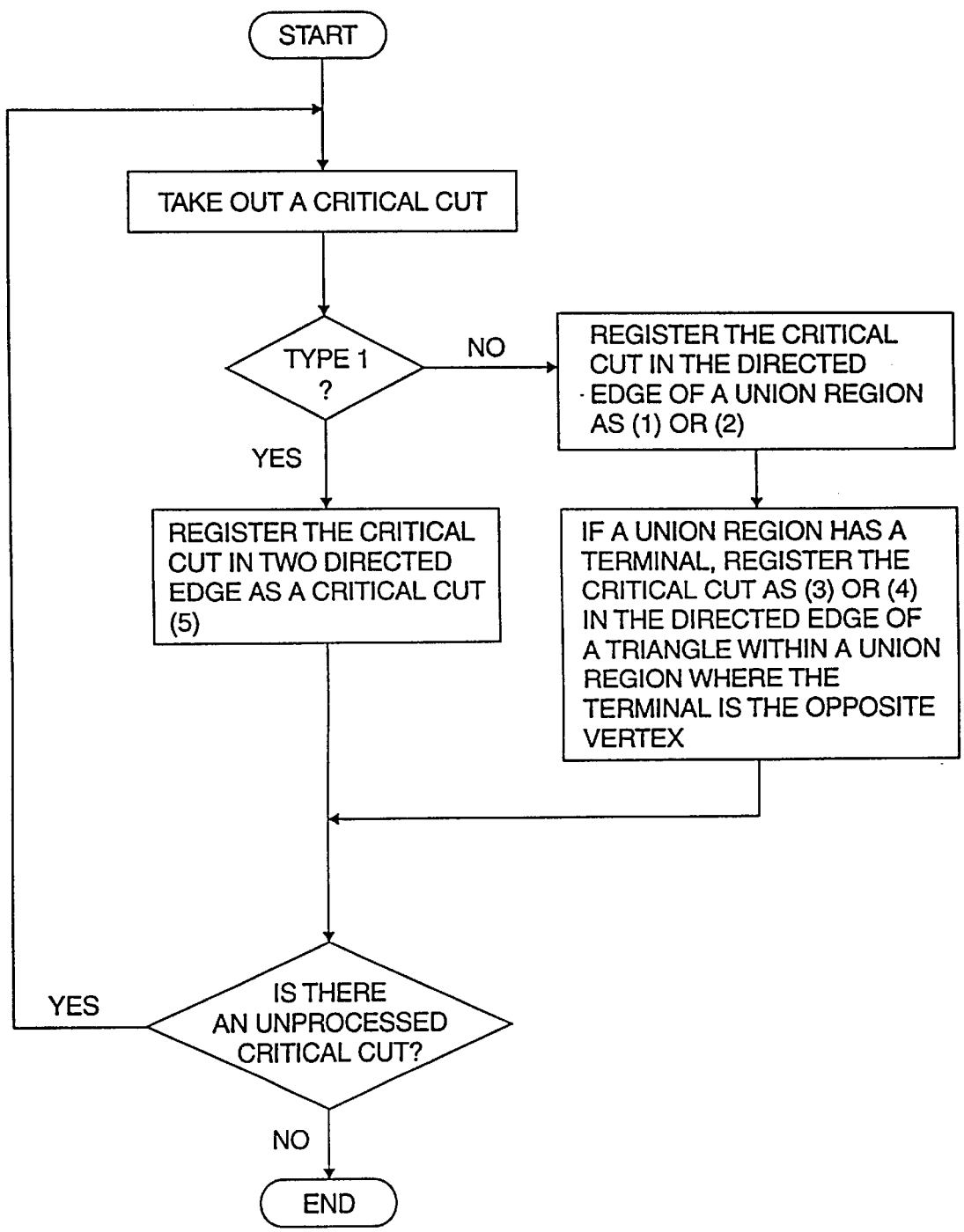
FIG. 13 is a diagram showing a processing flow for explaining the registration of critical cuts in the case where directed edges are used.

If FIG. 4 is changed based on the aforementioned processes so that it corresponds to the aforementioned five kinds of critical cuts, it will become as shown in FIG. 13. In the case of the type 2, a critical cut is registered, in directed edges surrounding a union region in one direction. It is determined whether directed edges surround the region in a counterclockwise direction or a clockwise direction. The same applies also for the critical cuts corresponding to (3) and (4).

(3) Process of Identifying a Crossing Critical Cut

As shown in a general example, the capacity of critical cuts is checked, while obtaining a shortest route by route search As this route search, IDA* (Iterative Deepening A*) can be used. The IDA* is basically a depth-first type search, so it holds a partial route from a start point and can verify the capacity limitation on the partial route. The IDA*, as with A*, uses the sum of the predicted values (heuristic values) of a distance from a start point and a distance to an end point as the evaluated values of best-first search. When the predicted value is evaluated to less than an actual remaining distance, it is guaranteed that a shortest route is obtained. Also, even in the evaluation of less than an actual distance, if the difference relative to an actual distance is smaller, a range that is searched will be reduced and a solution will be obtained at a high speed. In the route search, generally a shortest distance to an end point (Euclid distance) is often used, however, the error between a shortest distance and an actual distance becomes large depending the disposition of an obstacle and a range that is searched cannot be narrowed down. In the embodiment of the present invention, a shortest distance from an end point to each point is obtained by applying a Dijkstra's method in a backward direction, and a remaining distance is taken as a predicted value. However, for the critical cut corresponding to an edge of a triangular region and the critical cut included in the interior of one triangular region, it is possible to include a capacity check in one step of the Dijkstra's method. Then, a shortest route which meets route capacity is obtained for these critical cuts. In practice, there are many cases where a shortest route meeting this degree of capacity check meets the capacity of all routes until wires are considerably crowded, and IDA* can complete route search for wiring in a considerably short period of time. This routing does not form part of the present invention and therefore it will not be described any further. For a more detailed discussion on the route search for wiring, see L. Bole and J. Cytowski, "Search methods for Artificial Intelligence," Academic Press, 1992.

Figure 14:
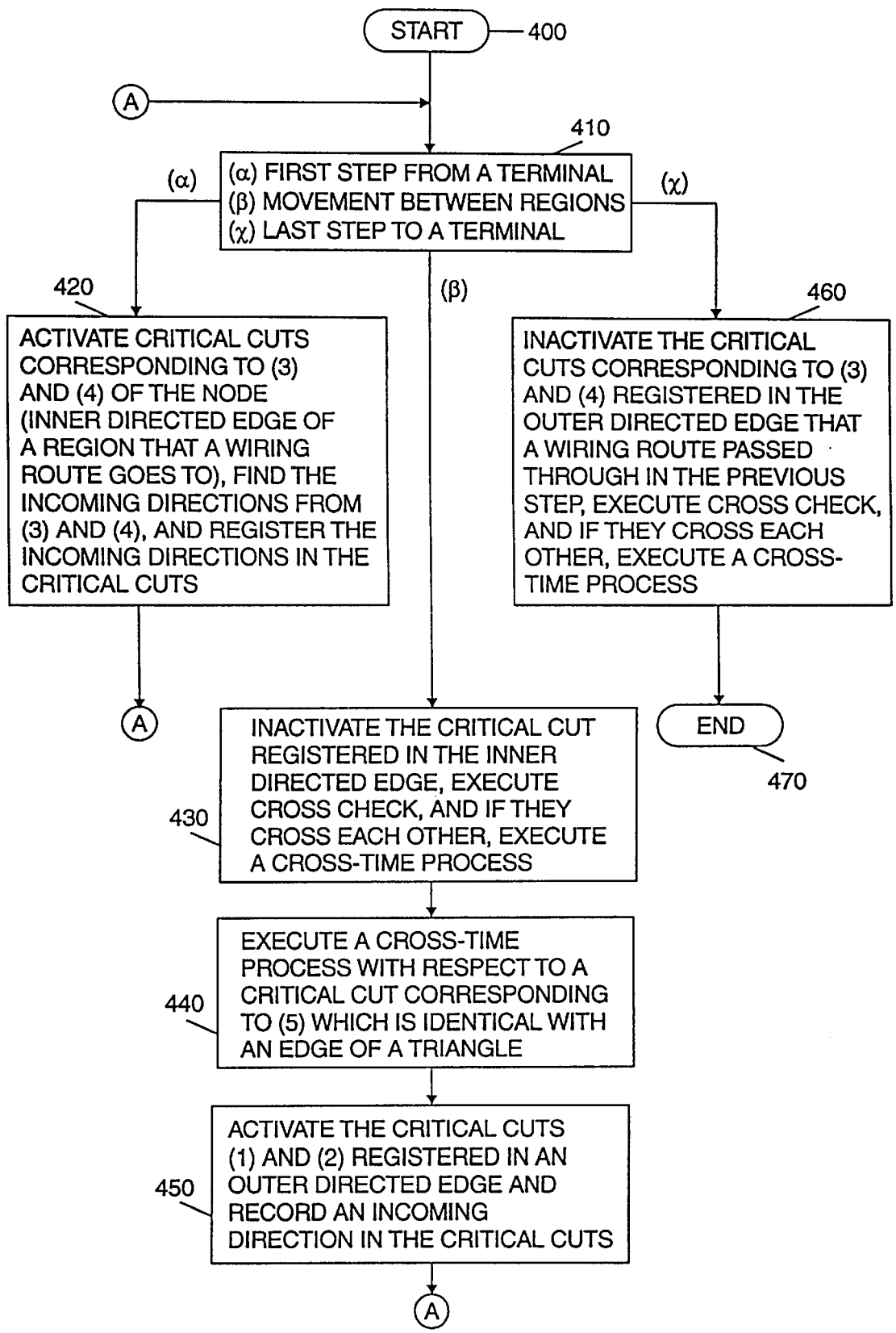
FIG. 14 is a diagram showing a processing flow for explaining the execution of the crossing check and cross-time processing of critical cuts in the case where directed edges are used.

In order to grow the branches of the search graph in the aforementioned way, the following steps are executed (FIG. 14). Directed edges in both directions correspond to an edge of a triangular region and are discriminated by referring to an directed edge which is a boundary of a region that the wiring route comes into as an outer directed branch and another as an inner directed edge. The outer directed edge represents a region that the wiring route comes into, and the inner directed edge represent a region from which the wiring route leaves. For example, when a union region is enclosed counterclockwise, an incoming direction is expressed by a counterclockwise directed edge and therefore the counterclockwise directed edge is taken to be an outer directed edge. Conversely, in the case of an outgoing direction, a clockwise directed edge is taken to be an inner directed edge.

First, processing is started in step 400 and classified into three cases in step 410. In the case of ($\alpha$) the first step from a terminal, as previously described, the movement of a wiring route from a terminal to a certain node corresponds to an outgoing direction when viewed from the directed edge of the node that the wiring route reached. Therefore, critical cuts corresponding to (3) and (4) of inner directed edges are activated. The (3) and (4) mean critical cuts which correspond to the third and fourth critical cuts of the aforementioned five kinds of critical cuts. Because it can be judged whether the inner directed edge is a right boundary or a left boundary by discriminating (3) and (4), the incoming direction of the wiring route is recorded in each critical cut (step 420). Also, in the case of ($\beta$) movement between regions, the critical cut registered in the inner directed edge is inactivated. It can be judged whether the wiring route crosses the critical cut of the inner directed edge by whether the critical cut is the aforementioned classification (1) or (2). When the wiring route crosses the critical cut, the aforementioned cross-time process is executed (step 430). If a critical cut such as corresponding to the aforementioned classification (5), which corresponds to an edge of a triangular region, exists, the cross-time process will be executed (step 440). Furthermore, the critical cuts (1) and (2) registered in the outer directed edges are activated, the incoming direction of the wiring route is recorded in the critical cuts by discriminating (1) and (2) (step 450).

In the case of ($\gamma$) the last step to a terminal, critical cuts, which correspond to the aforementioned classifications (3) and (4) registered in the outer directed edge through which the route has passed in the previous step, are inactivated. This is in a relationship opposite to the first step from a terminal. Then, crossing check is performed. When the wiring route crosses a critical cut, a cross-time process is executed (step 460). With this, search between terminals is ended (step 470).

The cross-time process in the case of crossing is the same as that described above, and even in the case where it is judged that the wiring route cannot cross, the process can be performed in the same way.

Figure 15:
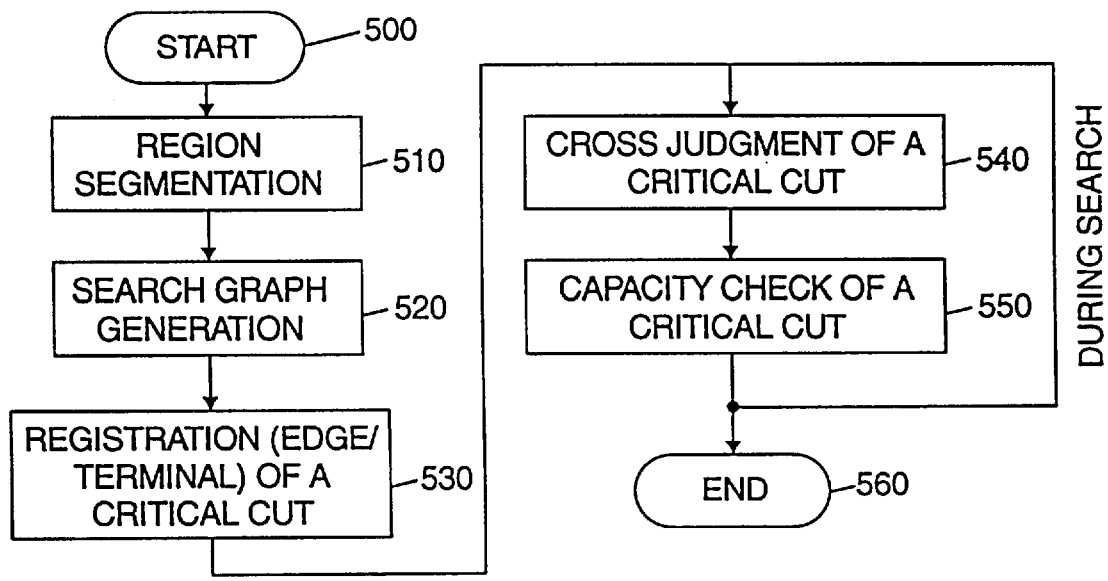
FIG. 15 is a diagram showing a processing flow of the entire processing for routing.

If done in the aforementioned way, a process of checking the capacity of a critical cut can be executed while searching a wiring route. The foregoing roughly becomes as shown in FIG. 15.

C. Process of Detecting a Critical Cut Whose Capacity Is Not Necessary to Check Thus, there is the need for edges (directed edges) to record many critical cuts and there is the need for performing crossing check and a cross-time process with respect to many critical cuts. Therefore, it is beneficial that critical cuts that are not necessary to check are found and that these critical cuts are not registered in the aforementioned process of registering critical cuts (FIG. 15). This process will hereinafter be described.

(1) Principles of the Invention

Figure 16:
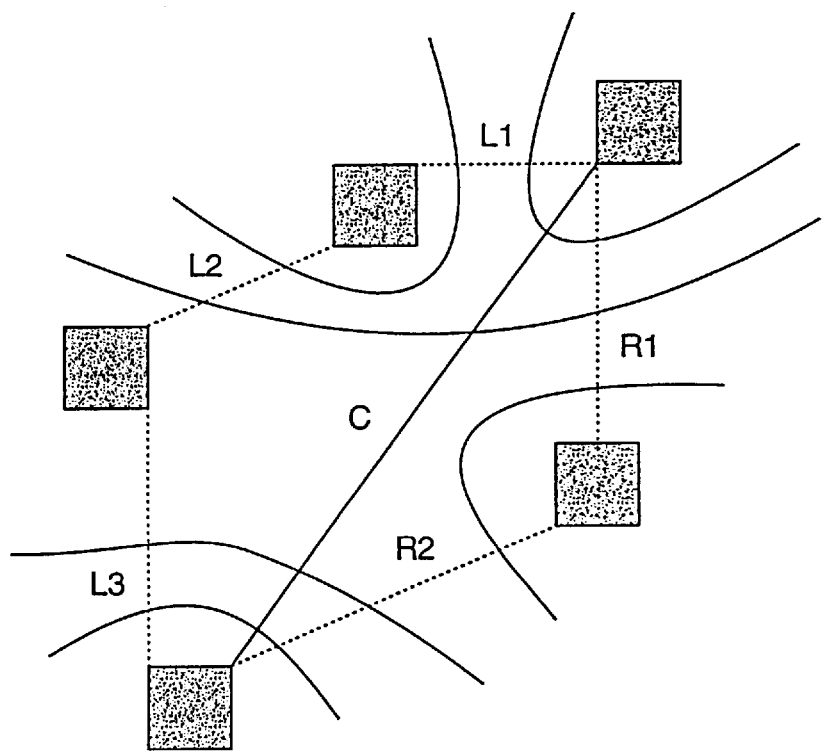
FIG. 16 is a diagram for explaining the principles of detection of a critical cut that is not necessary to check.

First, FIG. 16 is referred to. In the figure, C, L1, L2, L3, R1 and R2 are all critical cuts. Now, consider the critical cut C. The left side of the critical cut C is surrounded by L1, L2, and L3 and the right side is surrounded by R1 and R2, so the following relationship is obtained (the total width of all wires which pass through a critical cut X is assumed to be "Flow (X).").

Flow (C)$\leq$Flow (L1)+Flow (L2)+Flow (L3)
Flow (C)$\leq$Flow (R1)+Flow (R2)

Also, if the capacity of the critical cut is taken to be "Cap (X)" and the upper limit of the total wire width is taken to be "MaxFlow (X),"

Cap (C)$\geq$MaxFlow (L1)+Maxflow (L2)+MaxFlow (L3)
Cap (C)$\geq$MaxFlow (R1)+MaxFlow (R2)

Therefore, Cap (C)$\geq$MaxFlow (C) is obtained at all times and it is found that the capacity of this critical cut satisfies the total wire width without performing a capacity check.

In the case where there are no special conditions as in FIG. 16, if the capacities of surrounding critical cuts meet the total wire width, Cap (Li)$\geq$MaxFlow (Li) (i=1, 2, 3)
Cap (Ri)$\geq$MaxFlow (Ri) (i=1, 2)

Therefore, in the case of Cap (C)$\geq$Cap (L1)+Cap (L2)+Cap (L3) or Cap (C)$\geq$Cap (R1) +Cap (R2), the capacity of the critical cut C becomes unnecessary to check.

Figure 17:
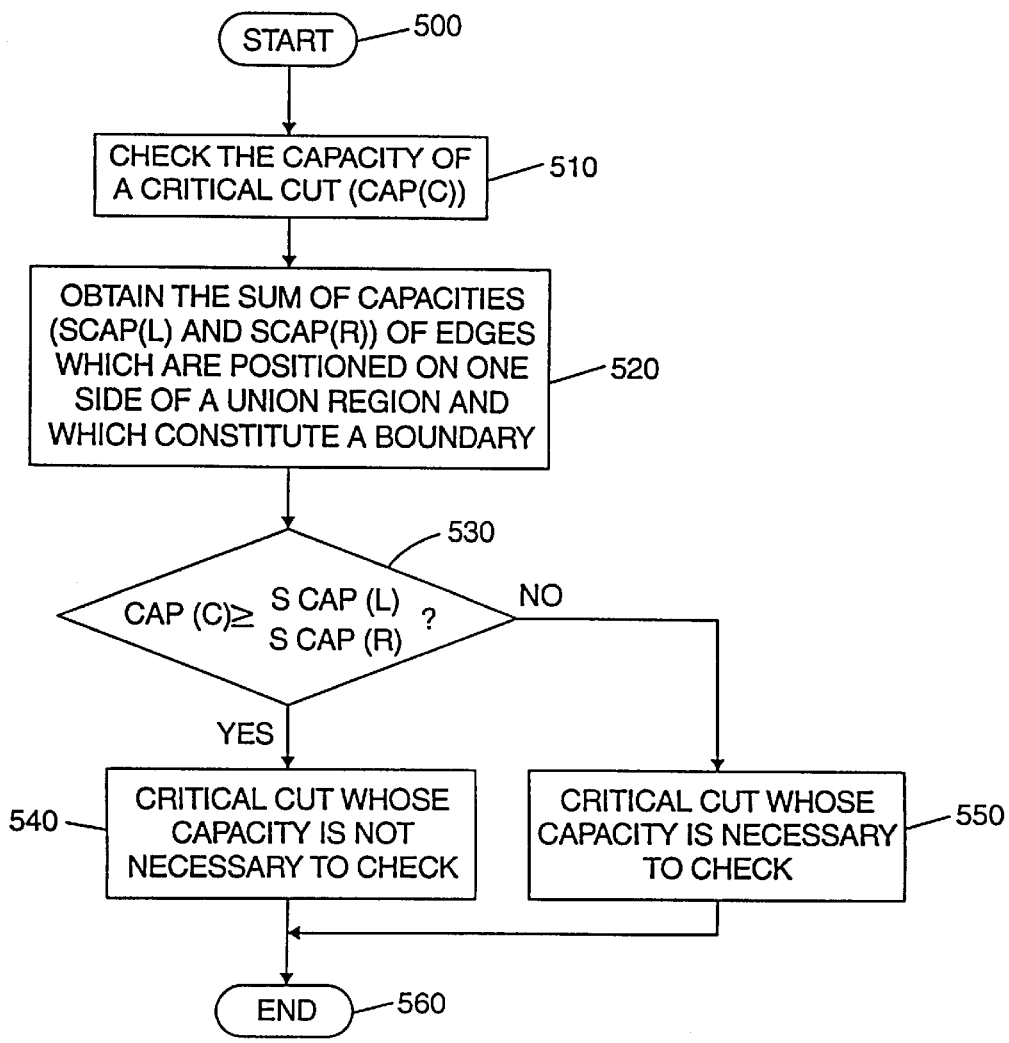
FIG. 17 is a diagram showing a processing flow of detection of a critical cut that is not necessary to check.

Therefore, the following process is performed. The process of FIG. 17 is started in step 500, and the capacity of a certain critical cut (Cap (C)) is first checked (step 510). Then, consider a union region consisting of regions that this critical cut crosses. The sum of capacities of edges constituting the boundary of this union region is obtained and, in this case, SCap. (L) or SCap (R) is obtained (step 520). If Cap (C)$\geq$SCap (R) or SCap (L) (step 530), the capacity check of the critical cut is not necessary (step 540). It on the other hand, Cap (C)<SCap (R) or SCap (L), the capacity check of the critical cut cannot be omitted (step 550). Step 510 does not need to be performed first, but it may be performed immediately before comparison.

While the sum of capacities of edges which constitute the boundary of a union region has been used, there are some cases where wiring is not performed until R and L are filled up with wires or until the capacity reaches near Cap (R) or Cap (L), depending on surrounding conditions. Therefore, in such a case, the sum of capacities becomes the sum of "substantial" capacities. (In the following, there are some cases where the aforementioned sum is the sum of the maximum flows of the maximum wire widths that the wiring route can pass through.)

(2) Process of Reducing the Number of Critical Cuts Which Are Necessary to Check in the Case of Triangular Segmentation A process of further reducing the number of critical cuts which are necessary to check will next be described. In the reduction, the condition of the board periphery is used as described above, and by reducing SCap (R) or SCap (L) by that condition, the number of cases which satisfy the aforementioned inequation is increased Notice that a process of segmenting a region into triangular regions has previously been described and therefore a description is omitted.

Figure 18:
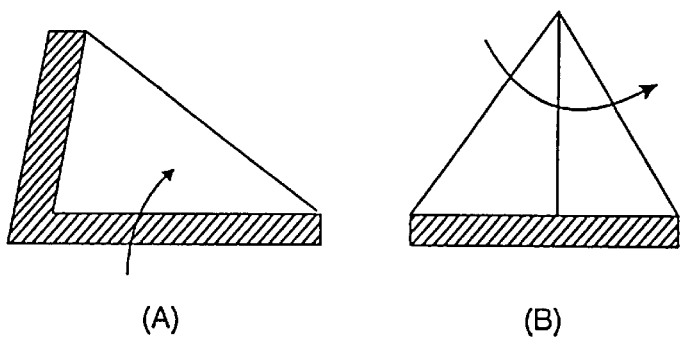
FIG. 18 is a diagram for explaining an example where the maximum flow of an edge is limited.

If there are no special conditions, the capacity of each edge of a triangular region is a shortest distance because a terminal is the vertex of a triangle, and similarly, the capacity is the maximum flow (MaxFlow). However, in an example such as FIG. 18, the maximum flow becomes less than the capacity. FIG. 18($a$) shows the case where two edges of a triangular region are an inhibition region or the periphery of a board. The flow of an edge such as being an inhibition region or the periphery of a board is zero. In FIG. 18,($a$) the flows of two edges are zero and therefore the flow of the remaining edge becomes zero. Also, the case of FIG. 18,($b$) is a case where one edge is an inhibition region or the periphery of a board and a critical cut extends from the opposite vertex. In such a case, flow indicated by an arrow is limited by the capacity of the critical cut. Of course, the capacity of the flow becomes less than that of the left or right edge.

Also, between three edges (a), (b), and (c) of a triangle ABC, the following relationship is established (Note that, when the vertex (A) is a terminal, the flow of one wire is added to the right side of the inequation).

MaxFlow (a)$\leq$MaxFlow (b)+MaxFlow (c)

When the maximum flow of each of three edges equals the capacity of an edge, the right side of the triangular inequation is larger than the Cap (a) and therefore this relationship is obvious. However, in a case where the maximum flow is less than the capacity of an edge, as in the case of FIG. 18, the upper limit of the flow of either one of the remaining two edges can be suppressed by using this relationship. Therefore, an initial value of the maximum flow of an edge of all triangles other than the aforementioned special edge is assumed to be the capacity of that edge. Processing starts with an edge where the maximum flow is less than the capacity of the edge, and the maximum flow of an adjacent triangle is updated by using the following rule.

MaxFlow (a)<–Min{MaxFlow (a), MaxFlow (b)+MaxFlow (c)}

The updated maximum flow is propagated, and the minimum value of the maximum flow of each edge of all triangles is estimated.

(3) Process of Identifying a Critical Cut That Is Necessary to Check

Figure 19:
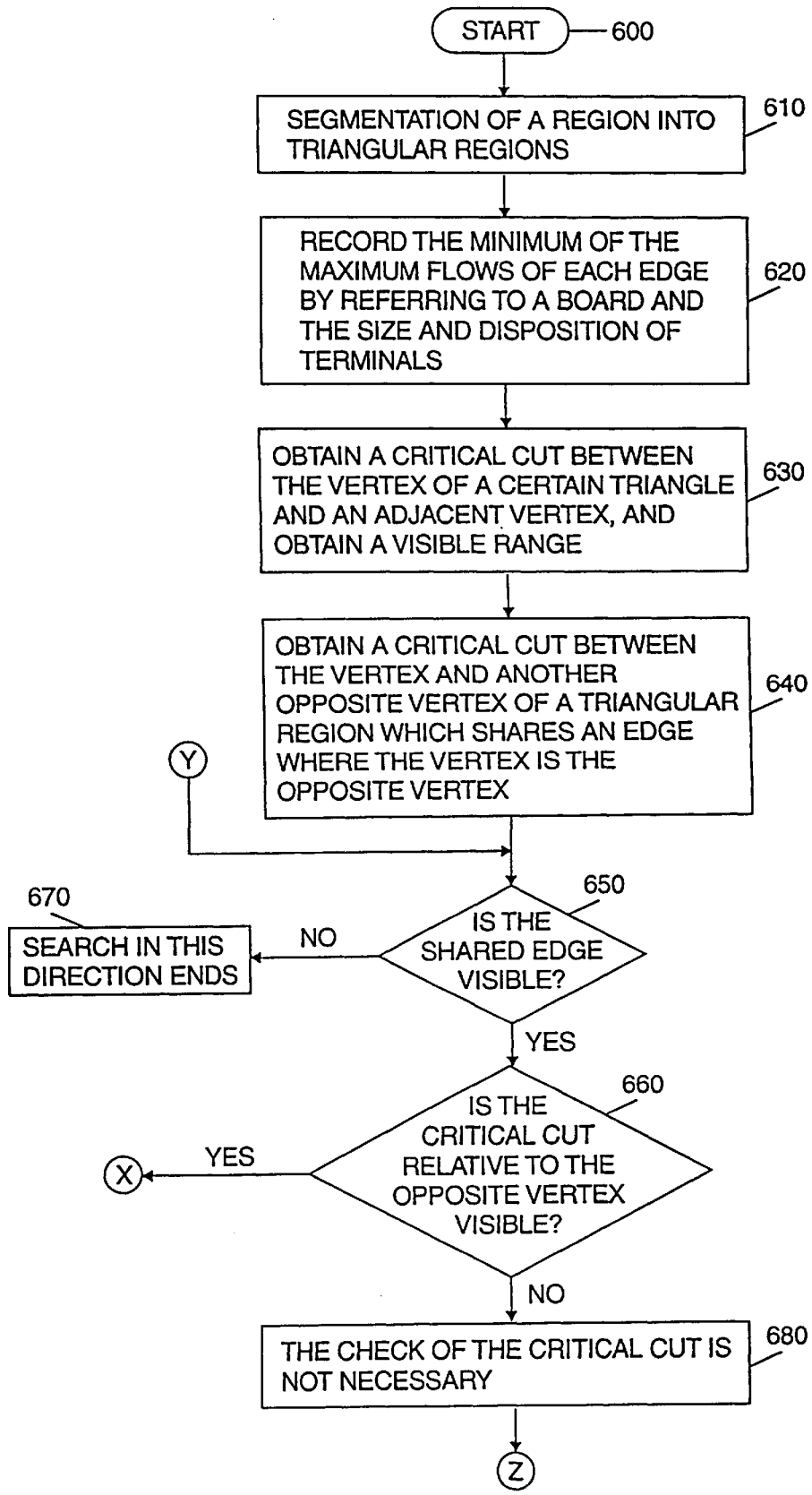
FIG. 19 is a diagram showing part of a processing flow for detecting a critical cut that is not necessary to check, in the case of triangular segmentation.
Figure 20:
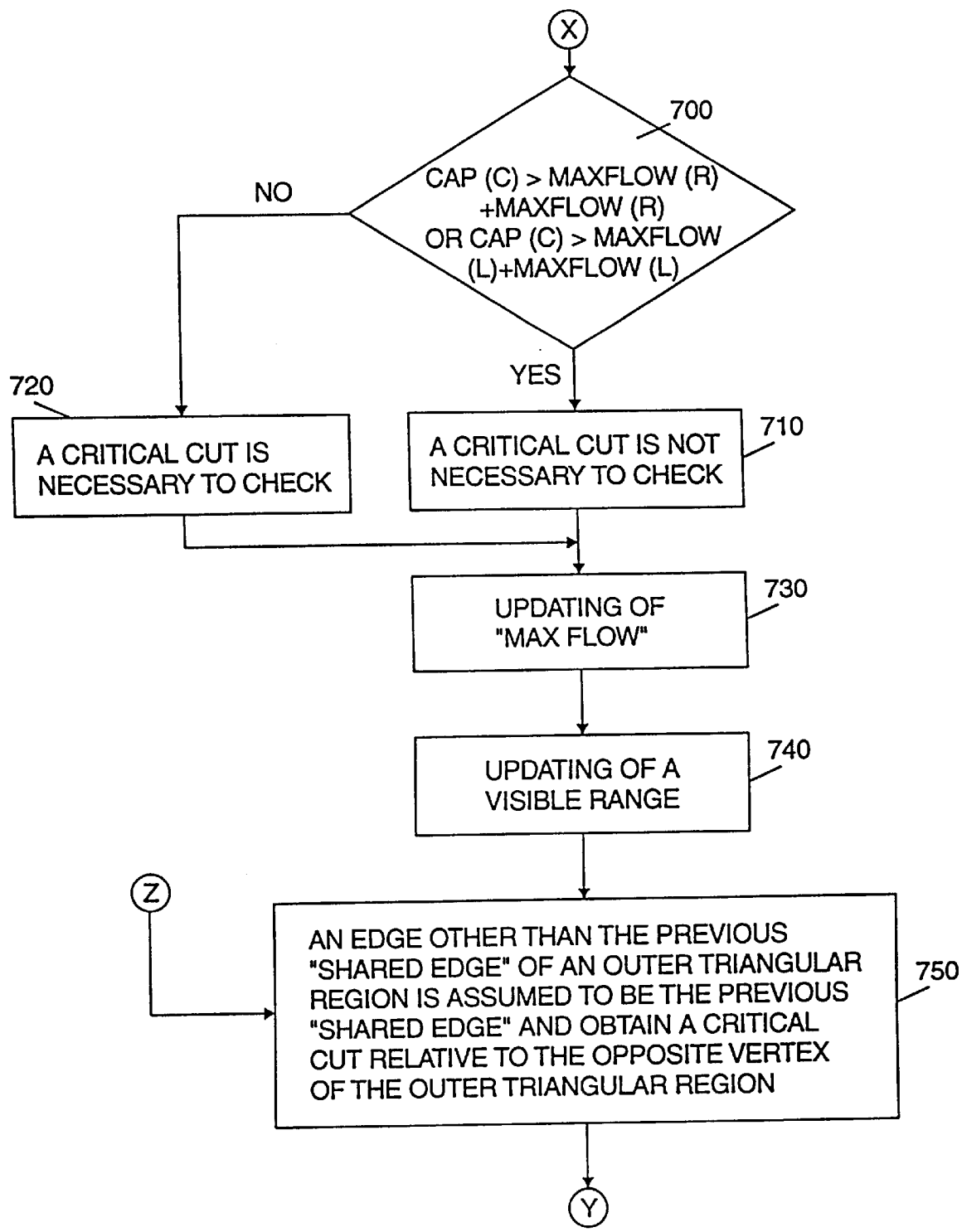
FIG. 20 is a diagram showing part of a processing flow for detecting a critical cut that is not necessary to check, in the case of triangular segmentation.

In view of the aforementioned processes, the identifying process becomes as shown in FIGS. 19 and 20. The process is started in step 600, and the aforementioned region is segmented into triangles (step 610). Then, by referring to a board and the size and disposition of terminals, the minimum of the maximum flows of each edge is recorded (step 620). This has previously been described. Thereafter, a critical cut is obtained between a vertex which is a terminal of a certain triangular region and the adjacent vertex. Also, these terminals are assumed to be obstacles, and a range (visible range), which is visible from the vertex (terminal) of the certain triangular region, is obtained (step 630).

Figure 21:
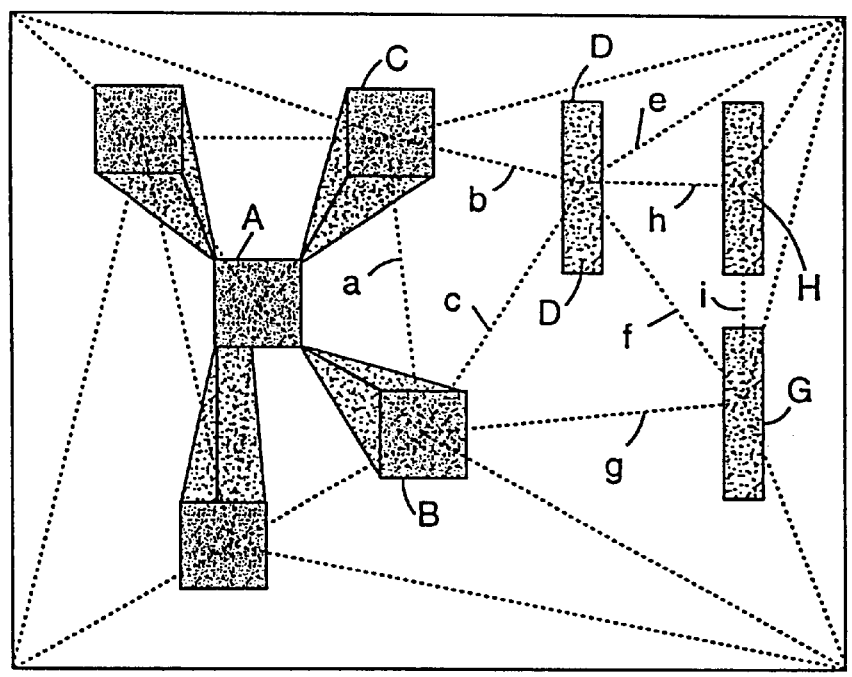
FIG. 21 is a diagram for explaining an embodiment of the processing flow of FIGS. 20 and 21.

Then, a critical cut is obtained between the vertex of the certain triangular region and the opposite vertex of a triangular region which shares an edge where the vertex (terminal) of the certain triangular region is the opposite vertex (step 640). In an example of FIG. 21 a critical cut is obtained between terminals (A) and (D). Therefore, it is judged whether an edge (in FIG. 21 an edge (a)), which is shared by a triangle including the terminal (A) and a triangle including the terminal (D), is included in the visible range of the terminal (A) (step 650). In FIG. 21, because the edge is, of course, included in the visible range, step 650 advances to step 660. In step 660 it is judged whether the critical cut between the vertex of the certain triangular region and the opposite vertex is visible. In the example of FIG. 21 the critical cut between the terminals (A) and (()) is included in the visible range of the terminal (A) and therefore step 650 advances to FIG. 20 through "X."

Then, it is checked whether Cap $(C) \geqq$ MaxFlow $(R)$+MaxFlow $(r)$ or Cap $(C) \geqq$ MaxFlow $(L)$+Maxflow $(1)$ (step 700 in FIG. 20). These R, r, L, and 1 are in a position relationship such as that shown in FIG. 22. That is, the critical cut between the terminals (A) and (C) is L and the critical cut between the terminals (A) and (B) is R. These critical cuts are obtained in step 630. Also, the 1 is the maximum flow of the edge (b) obtained in step 620, and the r is likewise the maximum flow of the edge (c).

If the aforementioned inequation is established, the critical cut C will not be necessary to check. If, on the other hand, the aforementioned inequation is not established, the critical cut C will be necessary to check. Then, the maximum flow is updated for the following process (step 740). When the edge (b) of FIG. 21 is processed, the following equations are assumed.

MaxFlow (R')=Min{MaxFlow (R)+MaxFlow (r'), Cap (C)}
MaxFlow (L')=MaxFlow (L)

When the edge (c) of FIG. 21 is processed, the following equation is assumed.

MaxFlow (R')=MaxFlow (R)
MaxFlow (L')=Min{MaxFlow (L)+MaxFlow (1), Cap (C)}

Figure 22:
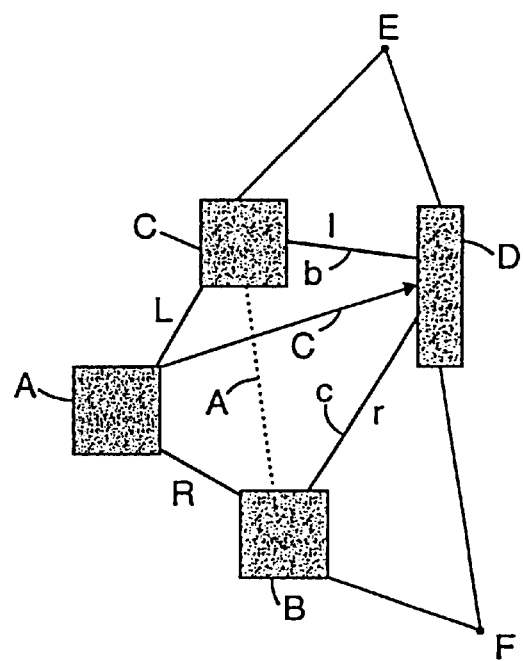
FIG. 22 is a diagram for explaining part of the processing flow of FIGS. 20 and 21.

This is shown in FIG. 22 and a new point (E) is provided. When the terminal (A) and (D) and the point (E) are considered, the number of wires which pass between the terminals (A) and (D) depends upon the smaller one of MaxFlow (R)+MaxFlow (r) or Cap (C). This becomes necessary when the edge (b) of FIG. 21 is processed. Similarly, when a new point (F) shown in FIG. 22 is provided and the terminal (A) and (D) and the point (F) are considered, the number of wires which pass between the terminals (A) and (D) depends upon the smaller one of MaxFlow (L)+MaxFlow (1) or Cap (C). This becomes necessary when the edge (c) of FIG. 21 is processed.

In addition, the opposite vertex on the outer side of the aforementioned shared edge is added and the visible range of the terminal (A) is updated (step 740). In the case of FIG. 21, the terminal (D) is also assumed to be an obstacle, and what is hidden by the terminal (D) is removed from an object of search.

After the aforementioned process is performed, the remaining two edges other than the shared edge of a triangle on the outer side of the shared edge where the terminal (A) is the opposite vertex is assumed to be the shared edge in step 650, and a critical cut is obtained between the opposite vertex of the remaining two edges and the terminal (A) (step 750). Step 750 returns to step 650 through "Y." In the example of FIG. 21, the remaining edges (()) and (c) of a triangle (abc), which shares the edge (a) where the terminal (A) is the opposite vertex, are assumed to be shared edges. Thereafter, consider binary trees, which have these two edges as roots, respectively. That is, this process advances from the edge (b) to edges (d) and (e) and from the edge (c) to edges (f) and (g). Then, a critical cut extending from the terminal (A) to the aforementioned board boundary or a terminal (G) is obtained.

The edges (b) and (c) are taken out and it is judged whether the edges (b) and (c) are in the visible range of the terminal (A) (step 650). Now, the edges (b) and (c) are judged to be visible. However, a critical cut relative to the boundary on upper side of the board through the edge (b) do not exist and therefore the edge (b) is judged to be invisible. Because a critical cut does not exist, checking becomes unnecessary. Even when an edge exists, checking will become unnecessary, if it is invisible (step 680). Step 680 advances to step 750 through "Z." When in step 650 an edge is judged to be invisible, the process ends (step 670). For the edge (b), visible edges do not exist even if the process further goes.

In the example of FIG. 21, the process with respect to the edge (c) continues. With the edge (c) as a shared edge, a critical cut is obtained between the terminal G which is the outer opposite vertex of the edge (c) and the terminal (A). Of course, the edge (c) is visible from the terminal (A), and the critical cut between the terminals (A) and (G) is also visible. Therefore, the process described in step 700 is performed to judge whether nor not the critical cut is necessary to check. In either case, the aforementioned updating processes in steps 730 and 740 are executed. If the process reaches the edge (g), the critical cut does not exist. If searching is further performed, an edge will be invisible. On the other hand, the edge (f) is visible, but the critical cut between the terminals (A) and (H) is invisible. Because an edge (i) is visible, this edge is processed. An edge (h) is invisible, so the process ends.

With the foregoing process, a critical cut which is not necessary to check and a critical cut which is necessary to check are discriminated. If a process such as this is executed before the aforementioned process of registering critical cuts of the route searching process, the number of critical cuts that are registered will be considerably reduced. With this, the burden of the capacity checking process is lightened.

Figure 23:
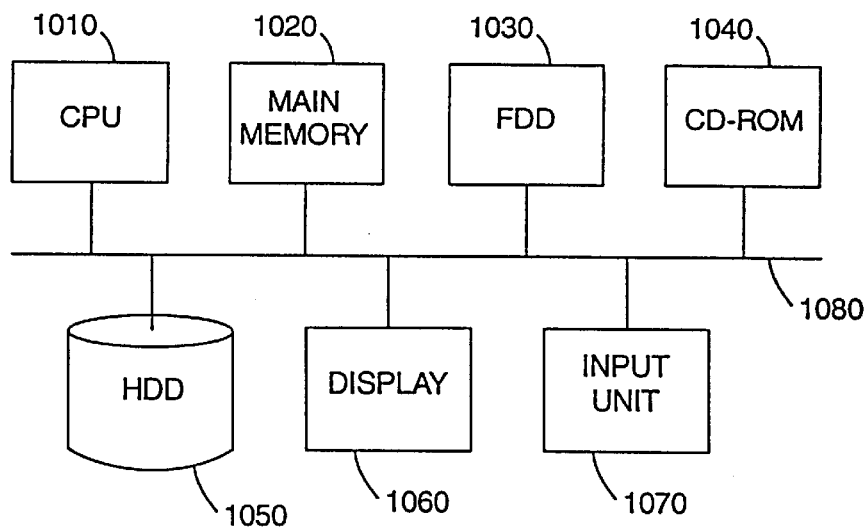
FIG. 23 is a diagram showing an example of the case where the present invention is carried out by a computer.

It is considered the aforementioned routing process and critical cut detecting process are realized and executed by a computer program as a processing program. The processes can be formed, for example, into a program that can be executed by a normal computer system such as that shown in FIG. 23. The processing program is stored in a HDD 1050. When the processing program is executed, it is loaded into a main memory 1020 and processed by a CPU 1010. Also, the HDD 1050 also includes the data about a board, such as positions of terminals, critical cuts, and a search graph, and the processing program accesses the data about hiss board. A finally obtained route is displayed to users by a display 1060. Users selects a terminal or inputs an instruction to output data through the input unit 1070 for route search. An input unit such as this includes a keyboard, a mouse, a pointing device, etc. Furthermore, a result of output can be stored in the floppy disk of a FDD 1030, which is a sub-storage device, or new data can be input from the FDD 1030. Moreover, data can also be input by using the CD-ROM drive 1040.

Furthermore, the computer program, which realizes the processing program of the present invention, can be stored in a recording medium such as a floppy disk or a CD-ROM and can be carried. There are some cases where a program used only for displaying data on the display 1060 has previously been stored in the HDD 1050. Parts other than that are usually distributed with a recording medium such as described above.

Figure 24:
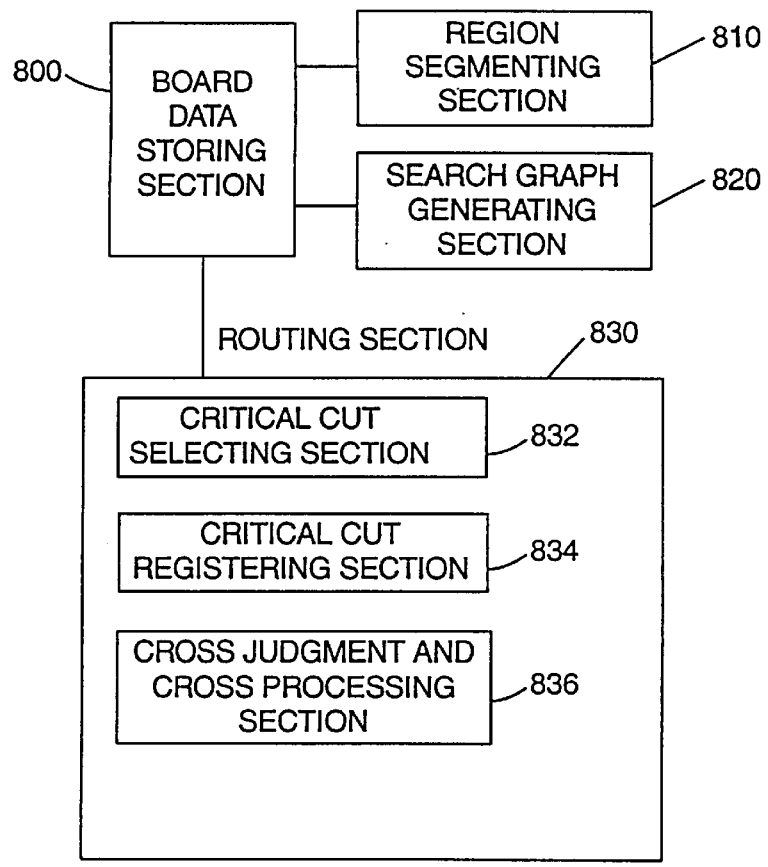
FIG. 24 is a diagram showing an example of the case where the present invention is carried out by a special apparatus.

Also, the aforementioned processes can be performed with a special apparatus (FIG. 24). In this case, a board data storing section 800 where the aforementioned data about a board is stored is connected to a region segmenting section 810, a search graph generating section 820, and a routing section 830. The board data storing section 800 stores the position data and size of a terminal and also stores the data about each region segmented by the region segmenting section 810. Also, if a search graph is generated by the search graph generating section 820, the data is likewise stored. After the region segmenting section 810 and the search graph generating section 820, the routing section 830 processes data. The routing section 830 is divided into a critical cut selecting section 832, a critical cut registering section 834, and a cross judgment and cross processing section 836. Note that, in addition these sections, sections for determining an actual route are included. The critical cut selecting section 832 is a section which performs a process of detecting a critical cut that is not necessary to check, described in the second half portion, and this section is optional. The critical cut registering section 834 performs a process of registering the data of the critical cut obtained from the board data storing section 800 in edges, and if the critical cut selecting section 832 exists, only critical cuts, which are determined in this process to be necessary to check, are processed. If this registering process ends, the cross judgment and cross processing section 836 judges whether the wiring route crosses each critical cut, and if the route crosses, the section 836 judges whether the capacity of the critical cut meets the aforementioned total wire width.

While the present invention has been described with reference to specific embodiments thereof, numerous variations and modifications are possible. Particularly, the invention is not limited to the embodiment shown in FIG. 24, which merely shows an example of functional blocks for carrying out the invention. The invention as defined herein has thus provided several distinctly advantageous features. First, it is possible to execute a wiring route search for wiring meeting an accurate route capacity, in a wiring route whose wiring capacity is limited, by checking the capacity of a critical cut during route search. Secondly, a wasteful recalculation of routes can be prevented and an automatic wiring process can be performed at a high speed. Thirdly, a system which is capable of automatic wiring at a free angle has been provided. Additionally, the wiring capacity check of a critical cut is performed, as described above, and the number of critical cuts whose wiring capacity is checked can be reduced. In the case of the aforementioned triangular segmentation, there is an actual case where the number of critical cuts is reduced to about $\frac{1}{5}$.

Accordingly, the high-speed operation of the entire route searching process has also been improved.

While there have been shown and described what are at present the preferred embodiments of the invention, it will be obvious to those skilled in the art that various changes and modifications may be made therein without departing from the scope of the invention as defined by the appended claims.

What is claimed is:

1. A method for detecting a critical cut that is not necessary to check, and determining a wiring capacity by using said critical cut, said critical cut being the minimum distance between two objects including a terminal disposed on a plane segmented into a plurality of triangular regions, said method comprising the steps of:

calculating a maximum flow by referring to a limitation on the size and disposition of said plane and terminal, the maximum flow being the maximum width of wires that can pass through each edge of said plurality of triangular regions;

calculating the wiring capacity for one critical cut;

in a union region consisting of the regions that said one critical cut crosses, calculating the sum of the maximum flows of edges being positioned on one side of said critical cut and constituting a boundary of said union region, updating, when said maximum flow of one edge of a triangular region is less than the sum of maximum flows of the other two edges of said triangular region, said maximum flow of said one edge to said sum of the maximum flows of the other two edges;

comparing said wiring capacity of said one critical cut with said sum of maximum flows; and when the wiring capacity of said one critical cut is the larger one, as judged by the comparison, outputting said one critical cut as a critical cut that is not necessary to check.

2. The method for detecting a critical cut of claim 1, wherein the step of calculating the sum of the maximum flows includes, when the edge of said triangular region is a boundary of an obstacle, and said boundary includes both the boundary of said plane and the boundary of a region that cannot be wired, a step of: setting said maximum flow of said edge to zero.

3. The method for detecting a critical cut of claim 2, wherein the step of calculating the sum of the maximum flows includes, when a critical cut from a vertex of said triangular region to the boundary of said obstacle is included in the interior of said triangular region, a step of: causing a maximum flow of an edge, other than an edge which is the boundary of said obstacle, to be the same as the wiring capacity of said critical cut.

\* \* \* \* \*